(12) United States Patent
Miyashita

(10) Patent No.: US 11,205,719 B2
(45) Date of Patent: Dec. 21, 2021

(54) INSULATED-GATE SEMICONDUCTOR DEVICE

(71) Applicant: FUJI ELECTRIC CO., LTD., Kawasaki (JP)

(72) Inventor: Hiroyuki Miyashita, Matsumoto (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 2 days.

(21) Appl. No.: 16/777,137

(22) Filed: Jan. 30, 2020

(65) Prior Publication Data
US 2020/0303540 A1  Sep. 24, 2020

(30) Foreign Application Priority Data

Mar. 22, 2019  (JP) ............................. JP2019-55519

(51) Int. Cl.
*H01L 29/78* (2006.01)
*H01L 29/16* (2006.01)
*H01L 29/10* (2006.01)

(52) U.S. Cl.
CPC ...... *H01L 29/7813* (2013.01); *H01L 29/1095* (2013.01); *H01L 29/1608* (2013.01)

(58) Field of Classification Search
CPC ............ H01L 29/7813; H01L 29/1095; H01L 29/1608; H01L 29/7397; H01L 29/0878; H01L 29/66734; H01L 29/66068; H01L 29/0696; H01L 29/0623; H01L 29/7827; H01L 29/0684; H01L 29/4236
See application file for complete search history.

(56) References Cited

U.S. PATENT DOCUMENTS

| 2017/0141186 A1* | 5/2017 | Shiomi ............... H01L 29/7813 |
| 2018/0197947 A1 | 7/2018 | Iwaya et al. |
| 2018/0197983 A1 | 7/2018 | Kinoshita et al. |
| 2019/0206985 A1 | 7/2019 | Iwaya et al. |

FOREIGN PATENT DOCUMENTS

| JP | 4738562 B2 | 5/2011 |
| WO | WO 2016/002766 A1 | 1/2016 |
| WO | WO 2017/064948 A1 | 4/2017 |
| WO | WO 2017/064949 A1 | 4/2017 |

* cited by examiner

*Primary Examiner* — Cuong B Nguyen

(57) ABSTRACT

An insulated-gate semiconductor device includes: a carrier transport layer of a first conductivity-type made of a semiconductor material having a wider band gap than silicon; a lower buried region of a second conductivity-type buried in an upper portion of the carrier transport layer; a plurality of upper buried regions of the second conductivity-type dispersedly deposited on the lower buried region; an injection control region of the second conductivity-type deposited on the upper buried regions; and an insulated gate structure controlling a surface potential of the injection control region adjacent to a side wall of a trench, wherein the trench has a stripe-like shape, the lower buried region includes a first stripe provided separately from the trench, and the respective upper buried regions are provided at intervals on the first stripe.

15 Claims, 19 Drawing Sheets

INSULATED-GATE SEMICONDUCTOR DEVICE

CROSS-REFERENCE TO RELATED APPLICATION

This application claims benefit of priority under 35 USC 119 based on Japanese Patent Application No. 2019-055519 filed on Mar. 22, 2019, the entire contents of which are incorporated by reference herein.

BACKGROUND OF THE INVENTION

1. Field of the Invention

The present invention relates to an insulated-gate semiconductor device having a trench gate structure.

2. Description of the Related Art

Trench gate MOSFETs, which are made of a wide-bandgap semiconductor such as silicon carbide (SiC), have a problem with a high electric field which tends to be applied to a gate insulating film provided at a bottom of a trench to cause damage to the gate insulating film.

To lessen electric field intensity at a bottom of a trench, a structure is suggested that includes a $p^+$-type buried region provided under the bottom of the trench, a $p^+$-type buried region (lower buried region) provided at the same horizontal level as the $p^+$-type buried region under the bottom of the trench, and a $p^+$-type buried region of (upper buried region) provided on the lower buried region, the lower buried region and the upper buried region being located under an injection control region in contact with the side surface of the trench. Such a structure may have a problem with the device characteristics which may vary if the lower buried region and the upper buried region are displaced from each other derived from the manufacturing process. Increasing the width of the lower buried region in order to prevent the positional displacement between the lower buried region and the upper buried region, however, inevitably increases a cell pitch.

WO 2016/002766 A1 discloses a trench gate MOSFET made of SiC, including a lower buried region (fifth region) and an upper buried region (second region) provided on the lower buried region and having a smaller width than the lower buried region. However, the width of the upper buried region (second region) cannot be reduced to more than a minimum processing dimension.

SUMMARY OF THE INVENTION

In response to the above issue, the present invention provides an insulated-gate semiconductor device capable of avoiding variation in device characteristics caused by displacement between a lower buried region and an upper buried region around a bottom of a trench derived from a manufacturing process without increasing a cell pitch.

An aspect of the present invention inheres in an insulated-gate semiconductor device, encompassing: a carrier transport layer of a first conductivity-type made of a semiconductor material having a wider band gap than silicon; a lower buried region of a second conductivity-type selectively buried in an upper portion of the carrier transport layer; a plurality of upper buried regions of the second conductivity-type dispersedly deposited on the lower buried region and buried in the upper portion of the carrier transport layer; an injection control region of the second conductivity-type deposited on the carrier transport layer and the upper buried regions; and an insulated gate structure using a trench penetrating the injection control region toward a top surface of the lower buried region so as to control a surface potential of the injection control region adjacent to a side wall of the trench, wherein the trench has a stripe-like shape in a planar pattern, the lower buried region includes a first stripe provided separately from the trench in the planar pattern, and the respective upper buried regions are provided at intervals on the first stripe.

DETAILED DESCRIPTION

Figure 1:
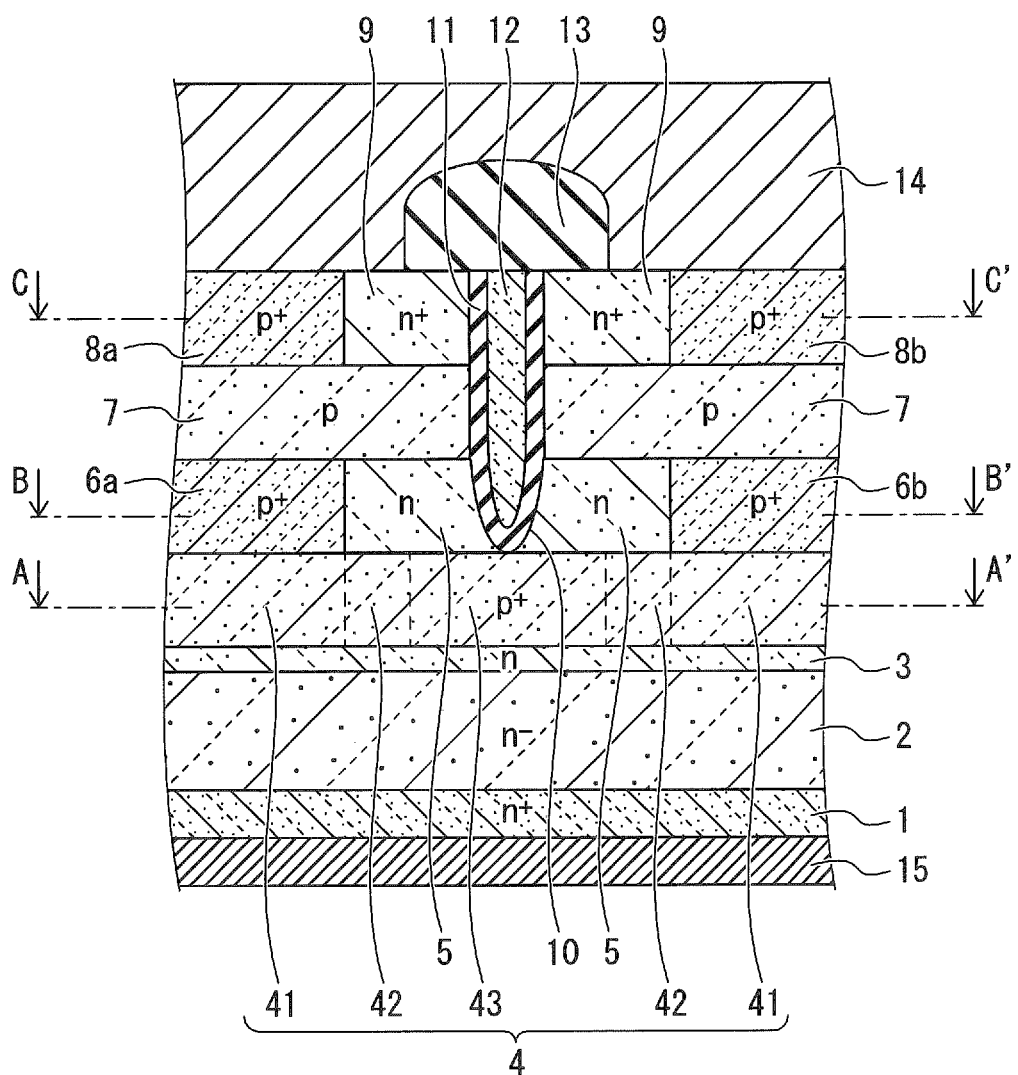
FIG. 1 is a cross-sectional view of main components illustrating an example of a semiconductor integrated circuit according to an embodiment of the present invention.

Hereinafter, an embodiment according to the present invention will be described with reference to the drawings. In the descriptions of the drawings below, the same or similar elements are indicated by the same or similar reference numerals, and overlapping explanations are not repeated below. It should be understood that the drawings are illustrated schematically, and are not drawn to scale. The embodiment described below illustrates a device and a method for embodying the technical ideas of the present invention which are not intended to be limited to the structures or arrangements of the elements as described herein.

In the Specification, a "carrier supply region" of the insulated-gate semiconductor device means a semiconductor region which supplies majority carriers as a main current. The carrier supply region is assigned to a semiconductor region which will be a source region in a metal-insulator-semiconductor field-effect transistor (MISFET) or a metal-insulator-semiconductor static induction transistor (MISSIT), an emitter region in an insulated-gate bipolar transistor (IGBT), and an anode region in a MIS control static induction (SI) thyristor. A "carrier reception region" means a semiconductor region which receive majority carriers as a main current. The carrier reception region is assigned to a semiconductor region which will be the drain region in the MISFET or the MISSIT, the collector region in the IGBT, and the cathode region in the MIS control SI thyristor. Note that there is a case that minority carriers, which have charges opposite to majority carries, are injected from the carrier reception region in a semiconductor device such as the IGBT and the MIS control SI thyristor performing a bipolar operation.

Further, definitions of directions such as an up-and-down direction in the following description are merely definitions for convenience of understanding, and are not intended to limit the technical ideas of the present invention. For example, as a matter of course, when the subject is observed while being rotated by 90°, the subject is understood by converting the up-and-down direction into the right-and-left direction. When the subject is observed while being rotated by 180°, the subject is understood by inverting the up-and-down direction.

Further, in the following description, there is exemplified a case where a first conductivity-type is an n-type and a second conductivity-type is a p-type. However, the relationship of the conductivity-types may be inverted to set the first conductivity-type to the p-type and the second conductivity-type to the n-type. Further, a semiconductor region denoted by the symbol "n" or "p" attached with "+" indicates that such semiconductor region has a relatively high impurity concentration as compared to a semiconductor region denoted by the symbol "n" or "p" without "+". A semiconductor region denoted by the symbol "n" or "p" attached with "−" indicates that such semiconductor region has a relatively low impurity concentration as compared to a semiconductor region denoted by the symbol "n" or "p" without "−". However, even when the semiconductor regions are denoted by the same reference symbols "n" and "n", it is not indicated that the semiconductor regions have exactly the same impurity concentration.

Embodiment

<Insulated-gate semiconductor device>

Figure 5:
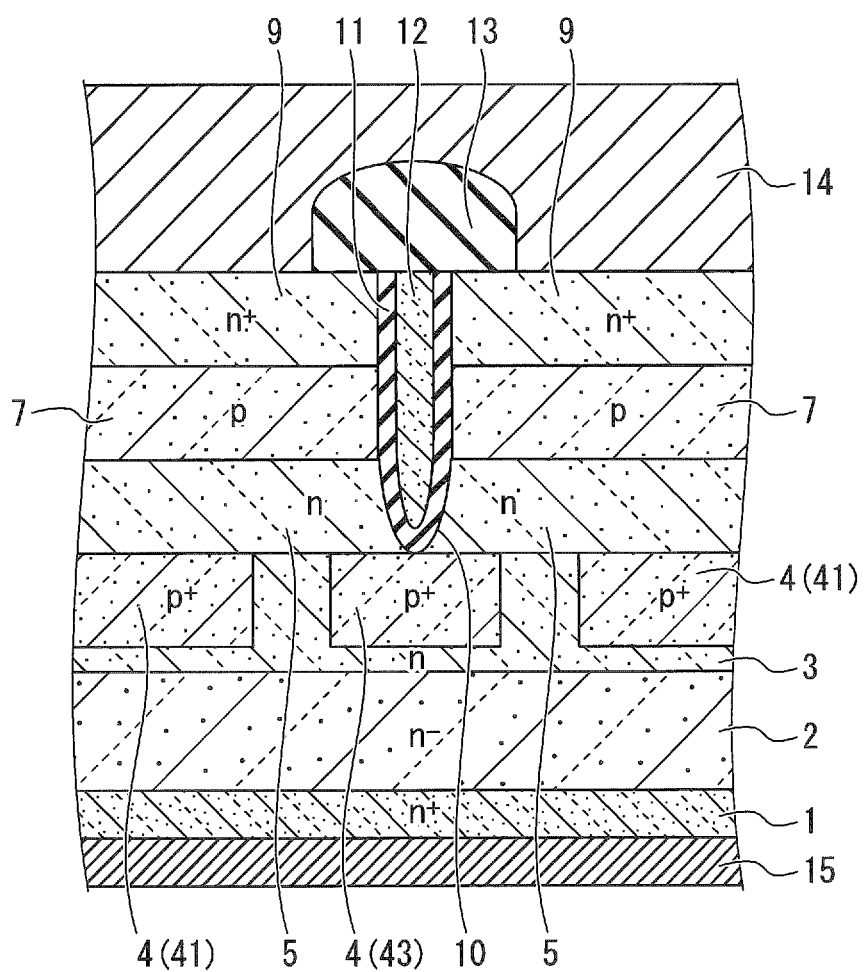
FIG. 5 is a vertical cross-sectional view as viewed from direction B-B' in FIG. 2 to FIG. 4.

An insulated-gate semiconductor device according to the embodiment of the present invention is illustrated below with a MISFET including a carrier transport layer (2, 3, 5) of a first conductivity-type (n-type), and an injection control region (base region) 7 of a second conductivity-type (p-type) stacked on the carrier transport layer (2, 3, 5), as illustrated in FIG. 1 and FIG. 5.

The carrier transport layer (2, 3, 5) is made of a semiconductor material, such as SiC, having a wider band gap than silicon. The carrier transport layer (2, 3, 5) includes a drift layer 2 of n⁻-type in which majority carriers as a main current drift by a drift electric field, and a carrier diffusion region (3, 5) of n-type deposited on the top surface (front surface) of the drift layer 2 and allowing the majority carriers injected from the injection control region 7 to be diffused and transferred.

The drift layer 2 is made of a SiC substrate, for example. The drift layer 2 has an impurity concentration set in a range of about $1 \times 10^{14}$ cm$^{-3}$ or greater and $1 \times 10^{16}$ cm$^{-3}$ or lower, for example.

The carrier diffusion region (3, 5) includes a lower current spreading layer (lower CSL) 3 of n-type provided on the top surface of the drift layer 2, and an upper current spreading layer (upper CSL) 5 provided on the top surface of the lower current spreading layer 3. The lower current spreading layer 3 and the upper current spreading layer 5 are each an epitaxially-grown layer of SiC, for example. The lower current spreading layer 3 and the upper current spreading layer 5 each have a higher impurity concentration than the drift layer 2, which is set in a range of about $1 \times 10^{16}$ cm$^{-3}$ or greater and $1 \times 10^{18}$ cm$^{-3}$ or lower, for example. The impurity concentrations of the lower current spreading layer 3 and the upper current spreading layer 5 may be either equivalent to or different from each other.

The injection control region 7 is deposited on the top surface of the upper current spreading layer 5. The amount of the majority carriers as a main current injected to the carrier diffusion region (3, 5) is controlled by the injection control region 7. The injection control region 7 is an epitaxially-grown layer of SiC, for example. The impurity concentration of the injection control region 7 is set in a range of about $1 \times 10^{16}$ cm$^{-3}$ or greater and $1 \times 10^{18}$ cm$^{-3}$ or lower, for example.

The insulated-gate semiconductor device according to the embodiment includes an insulated gate structure (11, 12) using a trench 10 penetrating the injection control region 7. The insulated gate structure (11, 12) controls a surface potential of the injection control region 7 adjacent to the side wall of the trench 10. The insulated gate structure (11, 12) includes a gate insulating film 11 laminated on the bottom and side surfaces of the trench 10, and a gate electrode 12 buried in the trench 10 via the gate insulating film 11.

Examples of films used as the gate insulating film 11 include a silicon oxide (SiO$_2$) film, a silicon oxynitride (SiON) film, a strontium oxide (SrO) film, a silicon nitride (Si$_3$N$_4$) film, an aluminum oxide (Al$_2$O$_3$) film, a magnesium oxide (MgO) film, an yttrium oxide (Y$_2$O$_3$) film, a hafnium oxide (HfO$_2$) film, a zirconium oxide (ZrO$_2$) film, a tantalum oxide (Ta$_2$O$_5$) film, a bismuth oxide (Bi$_2$O$_3$) film, and a composite film including two or more of these films stacked on one another.

The gate electrode 12 may be a polysilicon layer (doped polysilicon layer) to which p-type impurity ions such as boron (B) or n-type impurity ions such as phosphorus (P) are doped at a high concentration, or may be made of refractory metal. While FIG. 1 illustrates a case in which the top surface of the gate electrode 12 at the horizontal level conforms to the opening of the trench 10, the gate electrode 12 may extend to the top surface of a carrier supply region 9 via the gate insulating film 11.

The insulated-gate semiconductor device according to the embodiment includes a lower buried region 4 of the second conductivity-type (p-type) selectively buried in an upper portion of the carrier transport layer (2, 3, 5), and a plurality of upper buried regions 6a and 6b of p-type dispersedly deposited on the lower buried region 4 and selectively buried in the upper portion of the carrier transport layer (2, 3, 5).

The lower buried region 4 is provided on the lower current spreading layer 3 and includes at least a position separated from the trench 10. The lower buried region 4 has a higher impurity concentration than the injection control region 7, which is set in a range of about $5 \times 10^{17}$ cm$^{-3}$ or greater and $2 \times 10^{19}$ cm$^{-3}$ or lower, for example. The lower buried region 4 has a function of protecting the gate insulating film 11 at the bottom portion of the trench 10 against high voltage upon reverse bias.

The upper buried regions 6a and 6b are deposited in a region under the injection control region 7 and are separated from the trench 10. The impurity concentration of the upper buried regions 6a and 6b may be either equivalent to or different from the impurity concentration of the lower buried region 4. The impurity concentration of the upper buried regions 6a and 6b is set in a range of about $1 \times 10^{18}$ cm$^{-3}$ or greater and $1 \times 10^{19}$ cm$^{-3}$ or lower, for example.

The carrier supply region (source region) 9 of the first conductivity-type (n$^+$-type) and base contact regions 8a and 8b of the second conductivity-type (p$^+$-type) are each selectively deposited on the injection control region 7. The carrier supply region 9 is located over the upper current spreading layer 5. The carrier supply region 9 has a higher impurity concentration than the drift layer 2, which is set in a range of about $1 \times 10^{18}$ cm$^{-3}$ or greater and $1 \times 10^{21}$ cm$^{-3}$ or lower, for example.

The base contact regions 8a and 8b are in contact with the carrier supply region 9, and are located over the upper buried regions 6a and 6b. The base contact regions 8a and 8b have a higher impurity concentration than the injection control region 7, which is set in a range of about $1 \times 10^{20}$ cm$^{-3}$ or greater and $5 \times 10^{20}$ cm$^{-3}$ or lower, for example.

The trench 10 penetrates into the top surface of the carrier supply region 9 through the injection control region 7 toward the top surface of the lower buried region 4. The trench 10 has a depth set in a range of about 1 micrometer or greater and 2 micrometers or less, a width set in a range of about 0.3 micrometer or greater and 1 micrometer or less, and a distance set in a range of about 1 micrometer or greater and 5 micrometers or less. While FIG. 1 illustrates the case in which the trench 10 penetrates the upper current spreading layer 5 so that the bottom portion of the trench 10 is in contact with the lower buried region 4, the trench 10 does not necessarily penetrate the upper current spreading layer 5. For example, the bottom portion of the trench 10 may be opposed to the top surface of the lower buried region 4 via the upper current spreading layer 5 as thin as a Debye length remaining on the lower buried region 4. Namely, the bottom portion of the trench 10 is only required to be in contact with the lower buried region 4 or to be close to the lower buried region 4 via the carrier transport layer (2, 3, 5) by the order of the Debye length.

A first main electrode (source electrode) 14 is deposited on the gate electrode 12 via an interlayer insulating film 13. The interlayer insulating film 13 may be a non-doped silicon oxide (SiO$_2$) film without including phosphorus (P) or boron (B), which is referred to as non-doped silicate glass (NSG). Other examples of films used as the interlayer insulating film 13 include a phosphosilicate glass (PSG) film, a borosilicate glass (BSG) film, a borophosphosilicate glass (BPSG) film, and a silicon nitride (Si$_3$N$_4$) film. The interlayer insulating film 13 may also be a stacked film including the above films.

The first main electrode (source electrode) 14 is in contact with the carrier supply region 9 and the base contact regions 8a and 8b. The first main electrode 14 is provided separately from a gate surface electrode (not illustrated) located at the back side of the sheet of the drawing. Examples of material used for the first main electrode 14 and the gate surface electrode include aluminum (Al) and an Al—Si alloy. A source contact layer including nickel silicide (NiSix) and a barrier metal layer including titanium nitride (TiN) may be provided under the first main electrode 14.

A carrier reception region (drain region) 1 of n$^+$-type is deposited on the bottom surface of the drift layer 2. The carrier reception region 1 is formed such that n-type impurity ions are implanted in a lower portion of the drift layer 2, for example. The carrier reception region 1 has a higher impurity concentration than the drift layer 2, which is set in a range of about $1 \times 10^{17}$ cm$^{-3}$ or greater and $1 \times 10^{20}$ cm$^{-3}$ or lower, for example.

A second main electrode (drain electrode) 15 is deposited on the bottom surface of the carrier reception region 1. The second main electrode 15 may be a single film of gold (Au), or a metallic film in which aluminum (Al), nickel (Ni), and Au are stacked in this order. A metallic film such as molybdenum (Mo) or tungsten (W), or an alloy layer including nickel (Ni) and titanium (Ti) stacked to react with SiC may be provided between the carrier reception region 1 and the second main electrode 15.

FIG. 1 illustrates a unit structure including two inversion channels on both sides of the trench 10 for illustration purposes. The insulated-gate semiconductor device according to the embodiment may actually have a multi-channel structure in which the plural unit structures illustrated in FIG. 1 are continuously arranged to implement a power semiconductor device (power device) so as to carry a larger amount of current.

Figure 2:
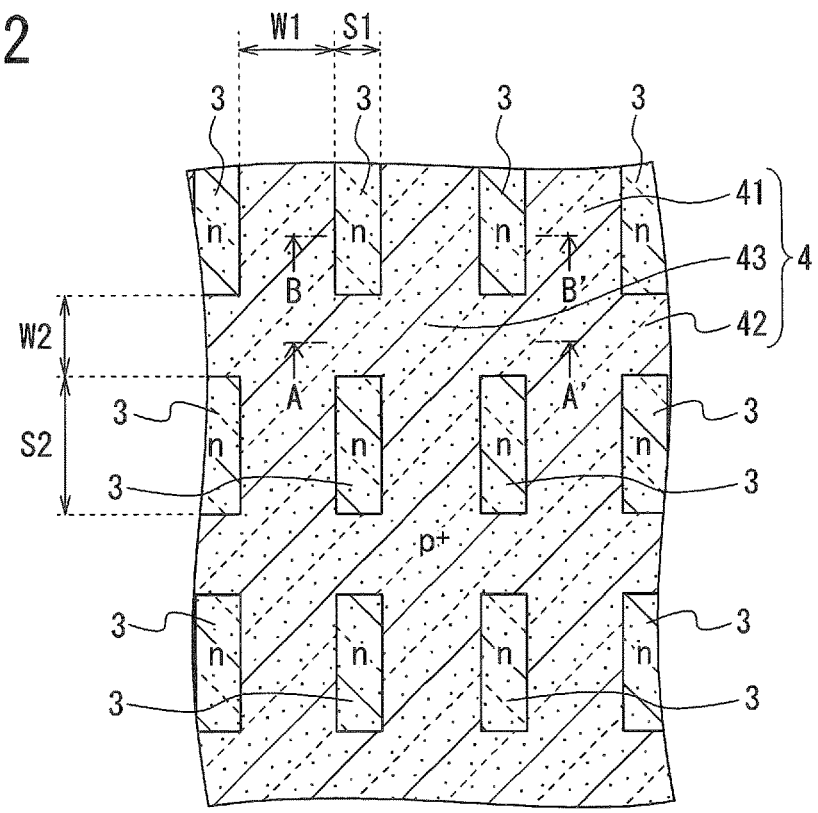
FIG. 2 is a horizontal cross-sectional view as viewed from direction A-A' in FIG. 1.
Figure 3:
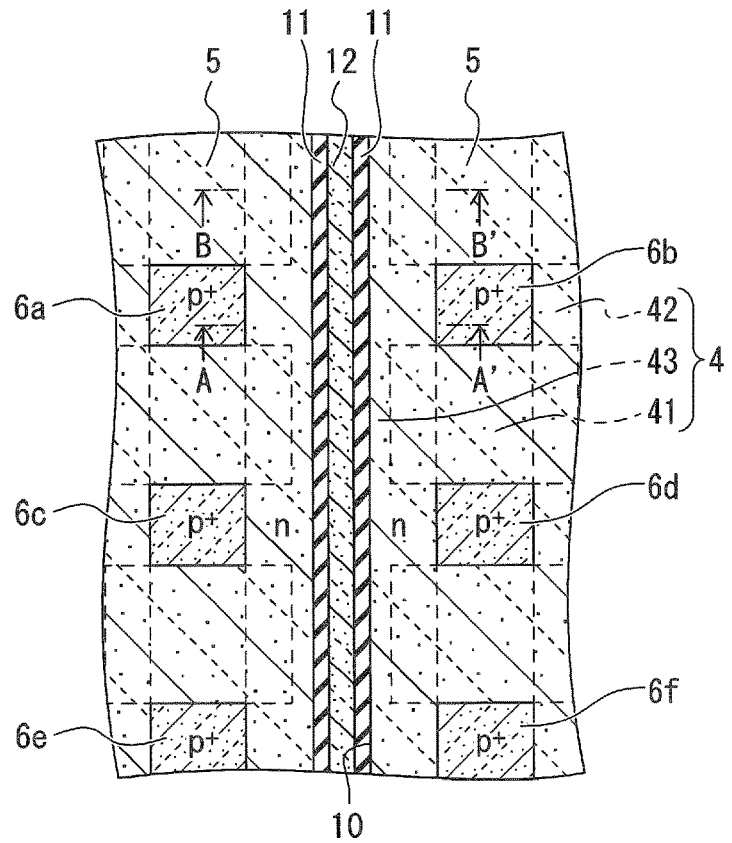
FIG. 3 is a horizontal cross-sectional view as viewed from direction B-B' in FIG. 1.
Figure 4:
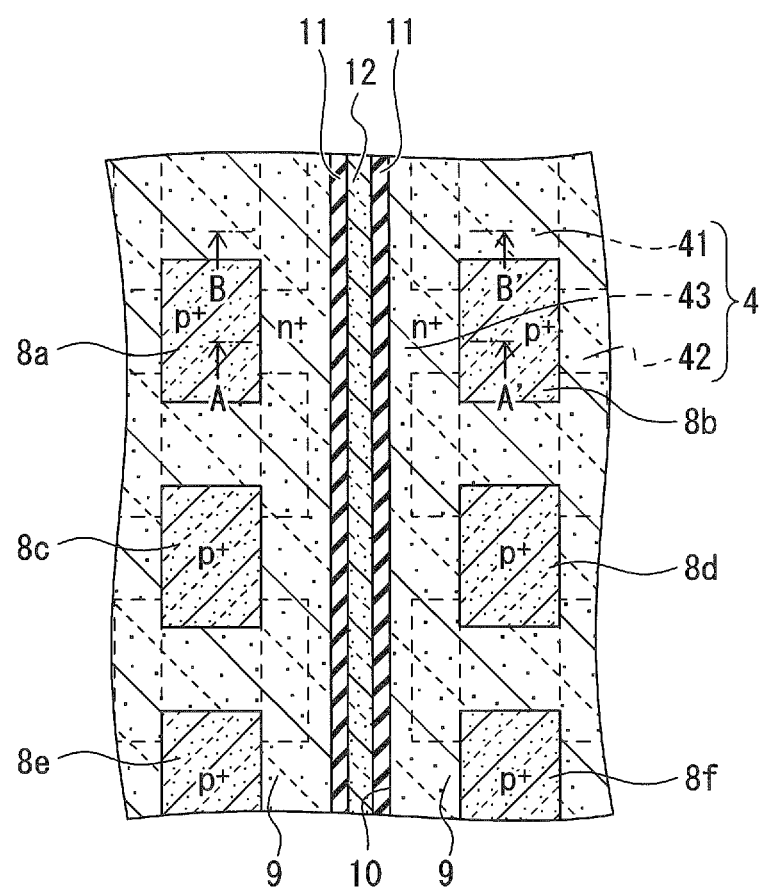
FIG. 4 is a horizontal cross-sectional view as viewed from direction C-C' in FIG. 1.

FIG. 2 is a horizontal cross-sectional view (planar layout) as viewed from direction A-A' in FIG. 1, illustrating the lower buried region 4 horizontally cross-sectioned. FIG. 3 is a horizontal cross-sectional view (planar layout) as viewed from direction B-B' in FIG. 1, illustrating the upper current spreading layer 5 and the upper buried regions 6a and 6b horizontally cross-sectioned. FIG. 4 is a horizontal cross-sectional view (planar layout) as viewed from direction C-C' in FIG. 1, illustrating the carrier supply region 9 and the base contact regions 8a and 8b horizontally cross-sectioned. The vertical cross-sectional views as viewed from direction A-A' in FIG. 2 to FIG. 4 correspond to the cross-sectional view of FIG. 1.

When the insulated-gate semiconductor device has the multi-channel structure, the lower buried region 4 has a matrix form in a planar pattern including a plurality of first stripes 41 extending in the orthogonal direction separately from the trench 10, a plurality of third stripes 43 extending in the orthogonal direction under the trench 10, and a plurality of second stripes 42 extending in the lateral direction and connecting the first stripes 41 and the third stripes 43 extending in the orthogonal direction, as illustrated in FIG. 2. The upper portion of the lower current spreading layer 3 appears at each window portion of the lower buried region 4 into a rectangular shape in a planar pattern. The planar pattern of the upper portion of the lower current spreading layer 3 includes the plural rectangular shapes alternately and continuously arranged in the orthogonal direction and in the lateral direction so as to have the multi-channel structure. The lower buried region 4 does not necessarily have the matrix form, and may have any arrangement when the second stripes 42 connect the first stripes 41 and the third stripes 43. The second stripes 42 and the third stripes 43 are not necessarily provided when the thickness of the gate insulating film 11 is increased at the bottom portion of the trench 10 as compared with the thickness on the side wall of the trench 10 so as to protect the gate insulating film 11 at the bottom portion against dielectric breakdown.

A width W1 of each orthogonal first stripe 41 and a width W2 of each lateral second stripe 42 in the lower buried region 4 may be either the same or different from each other. A space Si between the orthogonal first stripe 41 and the orthogonal third stripe 43 adjacent to each other and a space S2 between the adjacent two lateral second stripes 42 in the lower buried region 4 may be either the same or different from each other. A ratio of the width W2 of each lateral second stripe 42 to the space S2 between the adjacent two lateral second stripes 42 in the lower buried region 4 is set in a range of about 1:10 to 50, or may be set in a range of about 1:1 to 10.

The trench 10 has a stripe-like shape extending in the orthogonal direction in a planar pattern in FIG. 3. The respective upper buried regions 6a, 6b, 6c, 6d, 6e, and 6f are arranged on both sides of the trench 10 at intervals in the orthogonal direction in the planar pattern in FIG. 3. The upper buried regions 6a to 6f each have a rectangular shape in the planar pattern. The planar pattern and the size of the respective buried regions 6a to 6f may be determined as appropriate.

FIG. 3 illustrates the planar pattern of the upper buried regions 6a to 6f and the upper current spreading layer 5. FIG. 3 also schematically illustrates the planar pattern of the lower buried region 4 indicated by the broken lines located under the upper buried regions 6a to 6f and the upper current spreading layer 5. The lower buried region 4 has a topology in the matrix form in the planar pattern including the first stripes 41 extending in the orthogonal direction separately from the trench 10, the third stripes 43 extending in the orthogonal direction under the trench 10, and the second stripes 42 extending in the lateral direction. The upper buried regions 6a to 6f are arranged separately from the trench 10 at intervals on the orthogonal first stripes 41 in the lower buried region 4 in the planar pattern. The respective upper buried regions 6a to 6f are located at the intersection points of the orthogonal first stripes 41 and the lateral second stripes 42 in the lower buried region 4 in the planar pattern.

The base contact regions 8a, 8b, 8c, 8d, 8e, and 8f and the carrier supply region 9 illustrated in FIG. 4 are all located in the same horizontal level in the cross-sectional structure of FIG. 1. The base contact regions 8a to 8f are arranged on both sides of the trench 10 at intervals in the orthogonal direction in a planar pattern in FIG. 4. FIG. 4 also schematically illustrates the planar pattern of the lower buried region 4 indicated by the broken lines located under the base contact regions 8a to 8f. The base contact regions 8a to 8f are located over the first stripes 41. The base contact regions 8a to 8f are preferably at least partly provided on the corresponding upper buried regions 6a to 6f.

The vertical cross-sectional views as viewed from direction B-B' in FIG. 2 to FIG. 4 correspond to the cross-sectional view of FIG. 5. As illustrated in FIG. 5, the top surface of the lower current spreading layer 3 is in contact with the upper current spreading layer 5 through the gaps between the first stripes 41 and the third stripes 43 in the lower buried region 4 extending in the direction orthogonal to the sheet of the drawing.

The insulated-gate semiconductor device according to the embodiment as illustrated in FIG. 1 to FIG. 5 operates as an n-channel device. The n-channel insulated-gate semiconductor device applies a positive voltage to the second main electrode 15, and applies a positive voltage of a threshold or greater to the gate electrode 12, so as to form inversion channels in the injection control region 7 toward the gate electrode 12. The surface potential of the injection control region 7 adjacent to the side wall of the trench 10 is controlled by the insulated gate structure (11, 12) to form the inversion channels, and majority carriers as a main current are then injected to the drift layer 2 via the carrier diffusion region (3, 5), so as to be in the on-state. The injected majority carriers are received in the carrier reception region 1 via the carrier diffusion region (3, 5) and the drift layer 2. In the on-state, when the majority carriers are electrons, the main current flows from the second main electrode 15 to the first main electrode 14 via the carrier reception region 1, the drift layer 2, the carrier diffusion region (3, 5), the inversion channels in the injection control region 7, and the carrier supply region 9.

When the voltage applied to the gate electrode 12 is less than the threshold, no inversion channels are formed in the injection control region 7 to increase the height of the potential barrier with respect to the majority carriers as the main current, leading to the off-state. The main current thus stops flowing from the second main electrode 15 to the first main electrode 14.

Comparative Example

Figure 6:
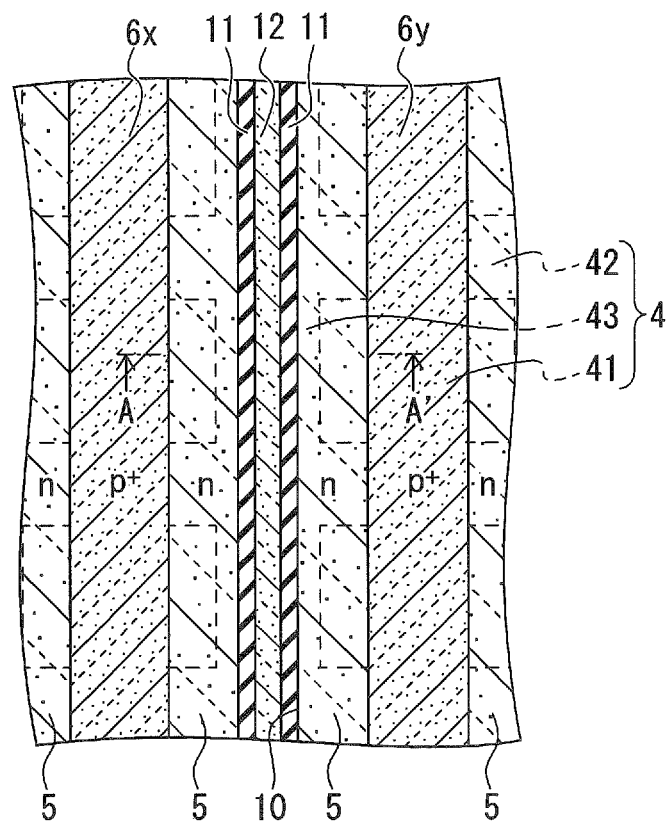
FIG. 6 is a horizontal cross-sectional view illustrating an insulated-gate semiconductor device according to a comparative example.
Figure 7:
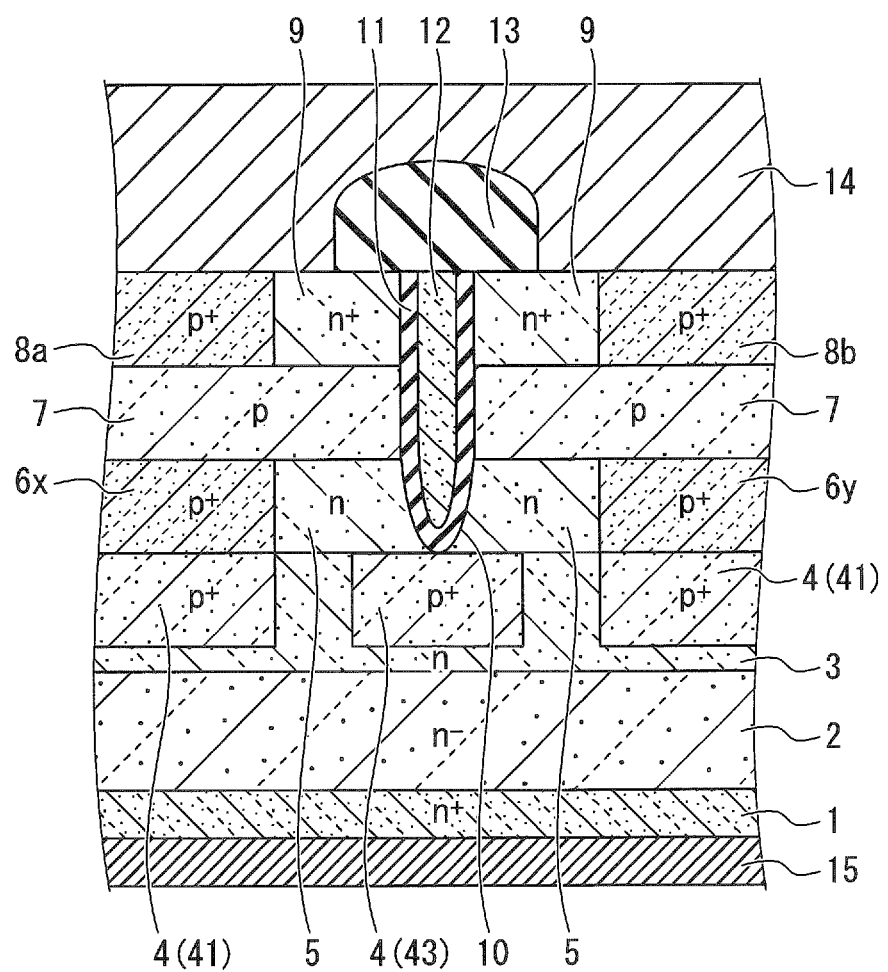
FIG. 7 is a vertical cross-sectional view as viewed from direction A-A' in FIG. 6.

An insulated-gate semiconductor device of a comparative example is described below. FIG. 6 is a horizontal cross-sectional view of the insulated-gate semiconductor device according to the comparative example corresponding to the horizontal cross-sectional view of the insulated-gate semiconductor device according to the embodiment illustrated in FIG. 3. FIG. 7 is a vertical cross-sectional view as viewed from direction A-A' in FIG. 6.

The insulated-gate semiconductor device according to the comparative example illustrated in FIG. 6 and FIG. 7 differs from the insulated-gate semiconductor device according to the embodiment in including upper buried regions 6x and 6y having a stripe-like shape in a planar pattern extending on the first stripes 41 extending in the orthogonal direction in the lower buried region 4. The other elements in the insulated-gate semiconductor device according to the comparative example are the same as those in the insulated-gate semiconductor device according to the embodiment.

Figure 8:
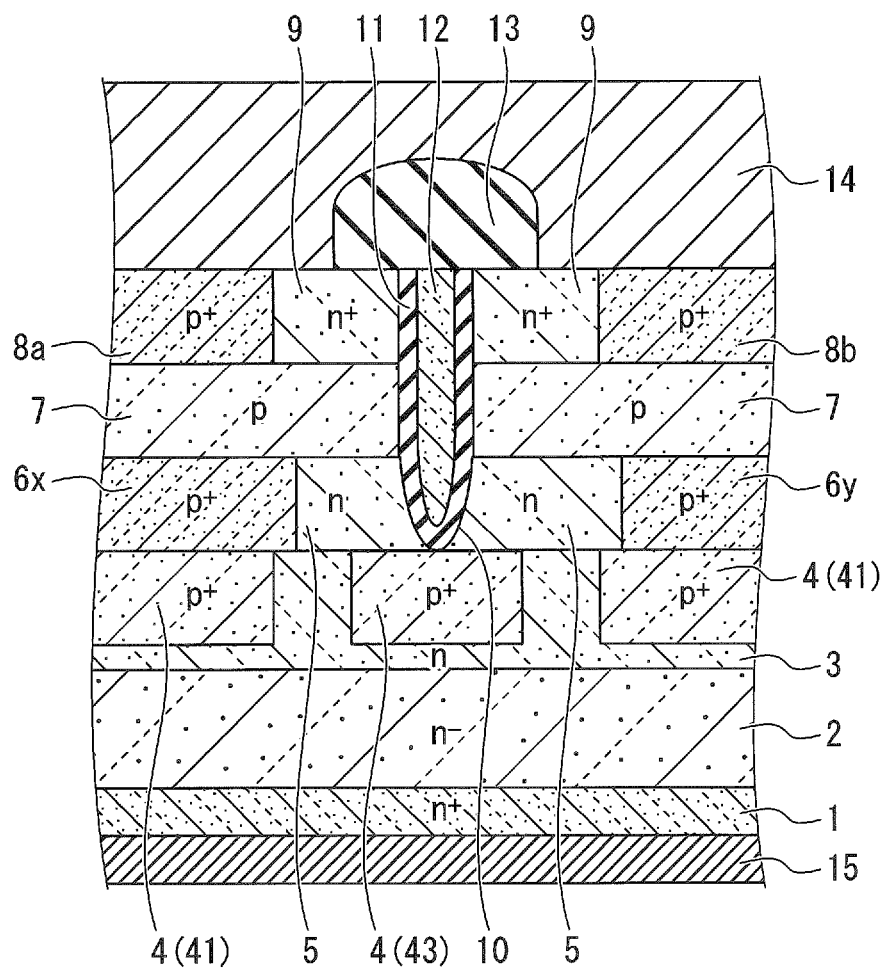
FIG. 8 is a vertical cross-sectional view in which a positional displacement is caused as viewed from direction A-A' in FIG. 6.

The insulated-gate semiconductor device according to the comparative example has a problem of positional displacement of mask patterns between the lower buried region 4 and the upper buried regions 6x and 6y in a photolithography step, as illustrated in FIG. 8. The positional displacement decreases a width (JFET width) at a position at which the upper current spreading layer 5 provided between the upper buried regions 6x and 6y overlaps with the lower current spreading layer 3 provided between the stripes of the lower buried region 4 to thus increase on-resistance, causing variation in the device characteristics. The width of the lower buried region 4 could be increased in order to avoid an influence of the positional displacement between the lower buried region 4 and the upper buried regions 6x and 6y. The increase in the width of the lower buried region 4, however, increases the cell pitch to result in an increase in on-resistance. In addition, the width of the respective upper buried regions 6x and 6y cannot be reduced to more than a minimum processing dimension.

Figure 9:
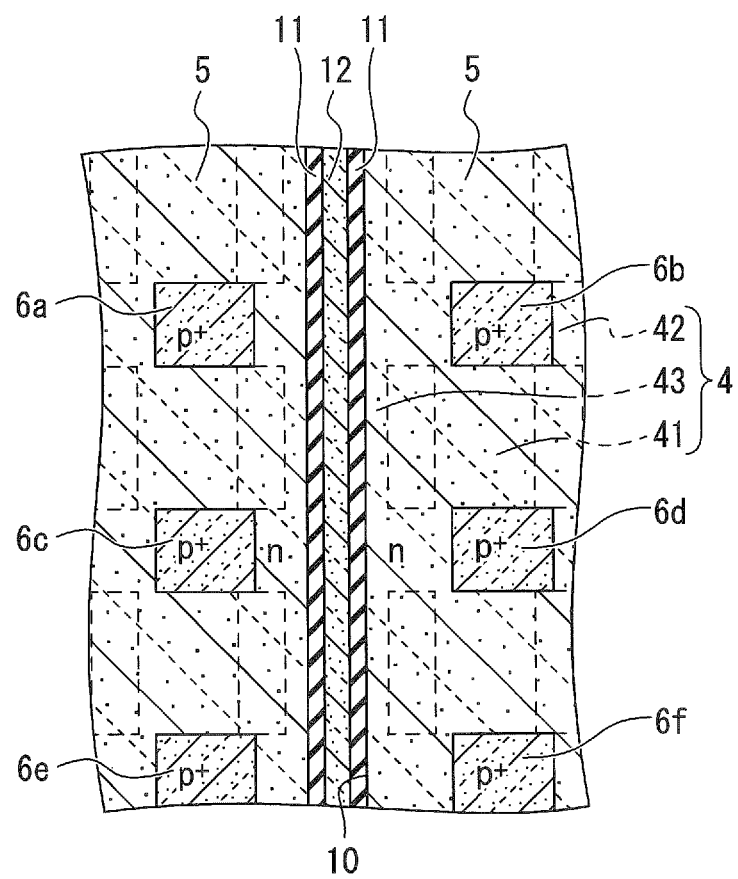
FIG. 9 is a horizontal cross-sectional view in which a positional displacement is caused as viewed from direction B-B' in FIG. 1.

In contrast, the insulated-gate semiconductor device according to the embodiment includes the upper buried regions 6a to 6f arranged at intervals in the orthogonal direction in the planar pattern on the orthogonal first strips 41 of the lower buried region 4, as illustrated in the drawings such as FIG. 3. The JFET width does not decrease in the region in which the upper buried regions 6a to 6f are not provided if the lower buried region 4 and the upper buried regions 6a to 6f are displaced from each other in the lateral direction, as illustrated in FIG. 9, so as to prevent an increase in on-resistance. This can reduce the influence on the device characteristics derived from the positional displacement between the lower buried region 4 and the upper buried regions 6a to 6f without increasing the cell pitch.

According to the insulated-gate semiconductor device according to the embodiment, the upper buried regions 6a to 6f are located at the intersection points of the orthogonal first stripes 41 and the lateral second stripes 42 in the lower buried region 4 in the planar pattern. The JFET width thus does not decrease even in the region in which the upper buried regions 6a to 6f are provided if the lower buried region 4 and the upper buried regions 6a to 6f are displaced from each other in the lateral direction, as illustrated in FIG. 9, so as to prevent an increase in on-resistance. This can reduce the influence on the device characteristics derived from the positional displacement between the lower buried region 4 and the upper buried regions 6a to 6f, as compared with the case in which the upper buried regions 6a to 6f are provided at other positions instead of the intersection points of the orthogonal first stripes 41 and the lateral second stripes 42 in the lower buried region 4 in the planar pattern.

The arrangement of the upper buried regions 6a to 6f at intervals in the orthogonal direction in the planar pattern decreases the total area of the upper buried regions 6a to 6f, as compared with the upper buried regions 6x and 6y in the insulated-gate semiconductor device according to the comparative example. The decrease in the area increases the voltage Vf in the forward direction in the built-in diode (body diode) implemented by the pn junction between the lower buried region 4 and the upper buried regions 6a to 6f and the lower current spreading layer 3, so as to avoid damage. Adjusting the impurity concentrations in the lower buried region 4 and the upper buried regions 6a to 6f can regulate the voltage Vf in the forward direction in the built-in diode. For example, increasing the impurity concentrations in the lower buried region 4 and the upper buried regions 6a to 6f can decrease the voltage Vf in the forward direction in the built-in diode by the amount increased in association with the decrease in the area of the upper buried regions 6a to 6f.

<Method of Manufacturing Insulated-Gate Semiconductor Device>

An example of a method of manufacturing the insulated-gate semiconductor device according to the embodiment is illustrated below with a case of a trench gate MISFET with reference to FIG. 10 to FIG. 19, while focusing on the cross section of the insulated-gate semiconductor device illustrated in FIG. 5. It should be understood that the method of manufacturing the trench gate MISFET described below is an example, and the embodiment of the present invention can implement various methods other than the following method including modified examples within the scope of the invention as defined by the following appended claims. For example, a semiconductor substrate of n⁻-type used in the following example can be replaced with a semiconductor substrate of n⁺-type provided with an epitaxially-grown film of n⁻-type.

Figure 10:
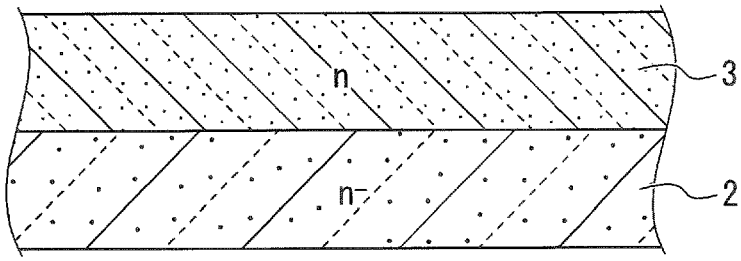
FIG. 10 is a cross-sectional view illustrating a process of manufacturing the insulated-gate semiconductor device according to the embodiment.

First, a semiconductor substrate (SiC substrate) of n⁻-type is prepared. The SiC substrate is a 4H-SiC substrate having an off-axis angle of four degrees on the top surface of the SiC substrate. Using the SiC substrate as the drift layer 2, the lower current spreading layer 3 of n-type is epitaxially grown on the top surface of the drift layer 2, as illustrated in FIG. 10. The lower current spreading layer 3 may be formed by ion implantation in the top surface of the drift layer 2 and annealing.

Next, a photoresist film is coated on the top surface of the lower current spreading layer 3, and is delineated by photolithography. Using the delineated photoresist film as a mask for etching, the upper portion of the lower current spreading layer 3 is partly and selectively removed by dry etching such as reactive ion etching (RIE), so as to form an alignment mark (not illustrated) having a rectangular shape, for example. The alignment mark is formed on a scribe line or a circumference of the device, for example, and is used for positioning upon exposure in the photolithography step described below. The photoresist film is removed after the formation of the alignment mark. The etching mask for the alignment mark may be a $SiO_2$ film.

Figure 11:
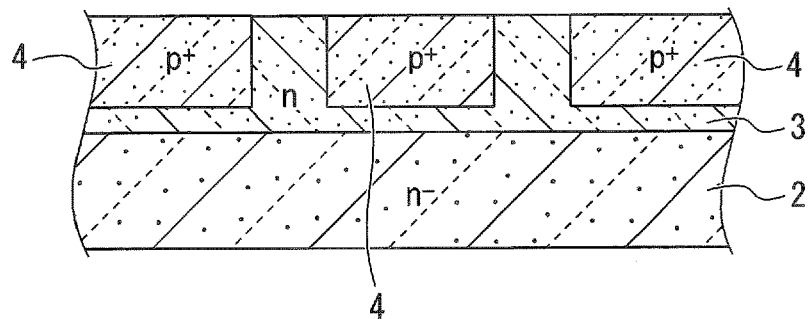
FIG. 11 is a cross-sectional view, continued from FIG. 10, illustrating the process of manufacturing the insulated-gate semiconductor device according to the embodiment.

Next, a $SiO_2$ film is laminated on the top surface of the lower current spreading layer 3, and another photoresist film is further coated on the $SiO_2$ film. The photoresist film is delineated by photolithography including the exposure and development using the alignment mark. The $SiO_2$ film is etched using the delineated photoresist film as a mask. The photoresist film is then removed. Using the delineated $SiO_2$ film as a mask for ion implantation, p-type impurity ions such as Al are implanted in the top surface of the lower current spreading layer 3. The mask for ion implantation is then removed, and the p-type impurity ions are activated by annealing, so as to selectively form the lower buried region 4 of $p^+$-type in the upper portion of the lower current spreading layer 3, as illustrated in FIG. 11.

Figure 12:
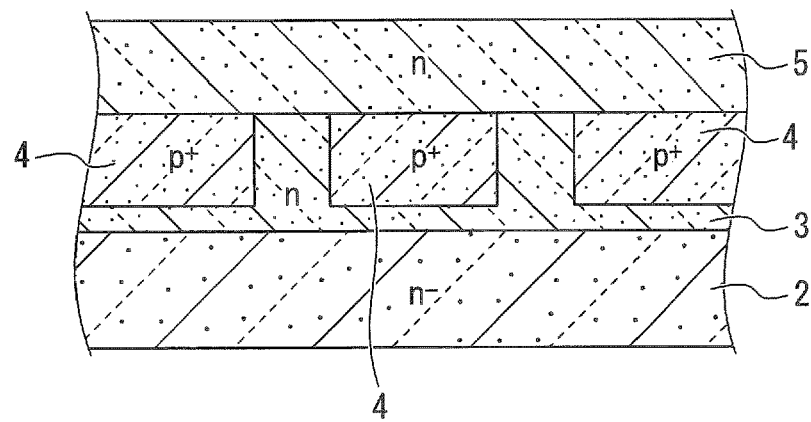
FIG. 12 is a cross-sectional view, continued from FIG. 11, illustrating the process of manufacturing the insulated-gate semiconductor device according to the embodiment.

Next, the upper current spreading layer 5 of n-type is epitaxially grown on the top surface of the lower buried region 4, so as to form the carrier diffusion region (3, 5) including the lower current spreading layer 3 and the upper current spreading layer 5 for the insulated-gate semiconductor device according to the embodiment, as illustrated in FIG. 12.

Figure 13A:
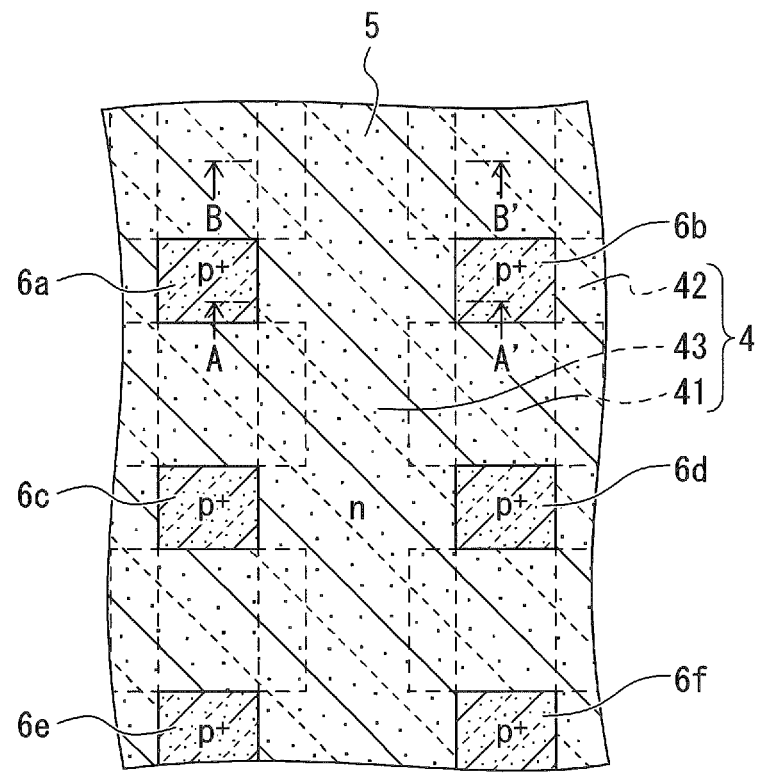
FIG. 13A is a cross-sectional view, continued from FIG. 12, illustrating the process of manufacturing the insulated-gate semiconductor device according to the embodiment.
Figure 13B:
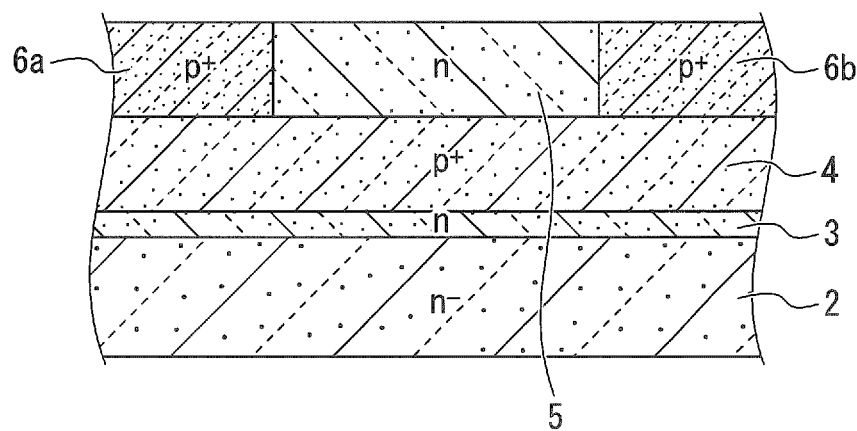
FIG. 13B is a cross-sectional view as viewed from direction A-A' in FIG. 13A.
Figure 13C:
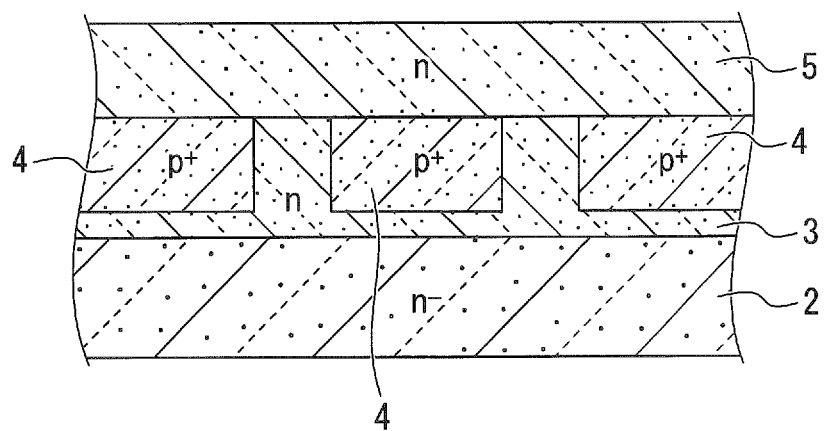
FIG. 13C is a cross-sectional view as viewed from direction B-B' in FIG. 13A.

Next, a $SiO_2$ film is laminated on the top surface of the upper current spreading layer 5, and a photoresist film is coated on the $SiO_2$ film. The photoresist film is delineated by photolithography including the exposure and development using the alignment mark. Using the delineated photoresist film as a mask, the $SiO_2$ film is etched to be delineated. The photoresist film is then removed. This photolithography step reads out the position of the alignment mark formed on the top surface of the lower current spreading layer 3 with an exposure device such as a stepper, so as to position the mask patterns of the lower buried region 4 and the upper buried regions 6a and 6b. Using the delineated $SiO_2$ film as a mask for ion implantation, p-type impurity ions such as Al are implanted. The mask for ion implantation is then removed, and the p-type impurity ions are activated by annealing, so as to selectively form the upper buried regions 6a and 6b of $p^+$-type in the upper portion of the upper current spreading layer 5, as illustrated in FIG. 13A to FIG. 13C. The positional displacement between the pattern of the lower buried region 4 and the pattern of the upper buried regions 6a and 6b may be caused, regardless of the use of the alignment mark, derived from the off-axis angle on the top surface of the SiC substrate or depending on the performance of the exposure device.

Figure 14:
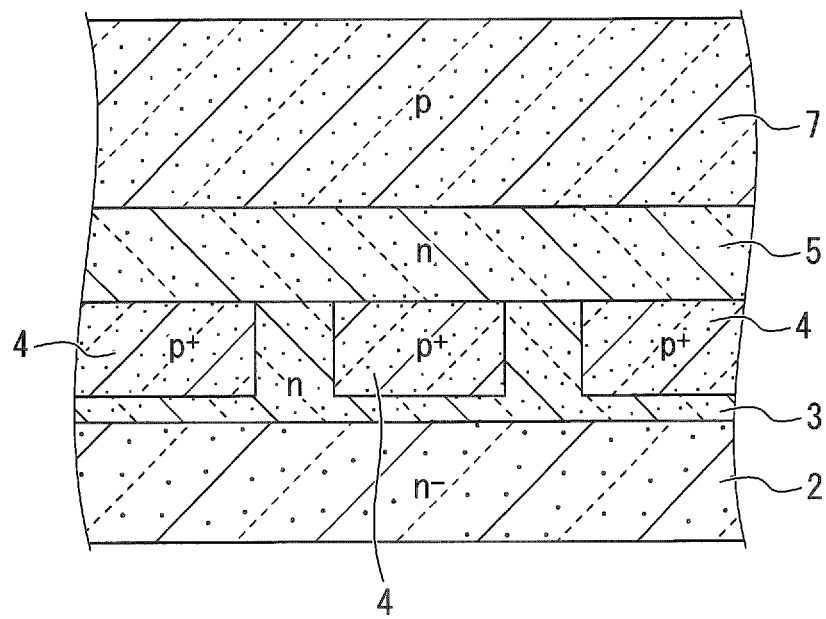
FIG. 14 is a cross-sectional view, continued from FIG. 13A to FIG. 13C, illustrating the process of manufacturing the insulated-gate semiconductor device according to the embodiment.

Next, the injection control region 7 of p-type is epitaxially grown on the top surface of the upper current spreading layer 5 composing the carrier diffusion region (3, 5), as illustrated in FIG. 14.

Figure 15A:
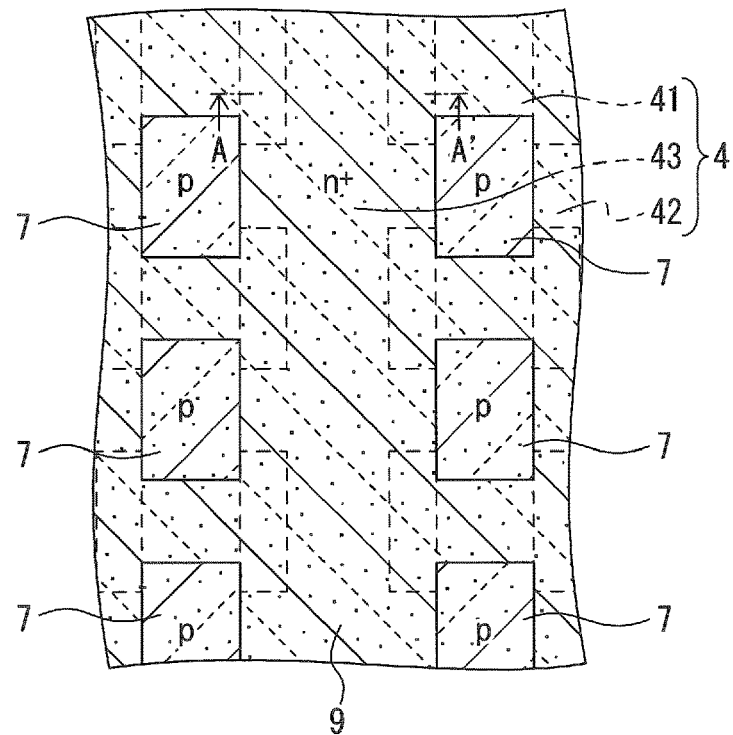
FIG. 15A is a cross-sectional view, continued from FIG. 14, illustrating the process of manufacturing the insulated-gate semiconductor device according to the embodiment.
Figure 15B:
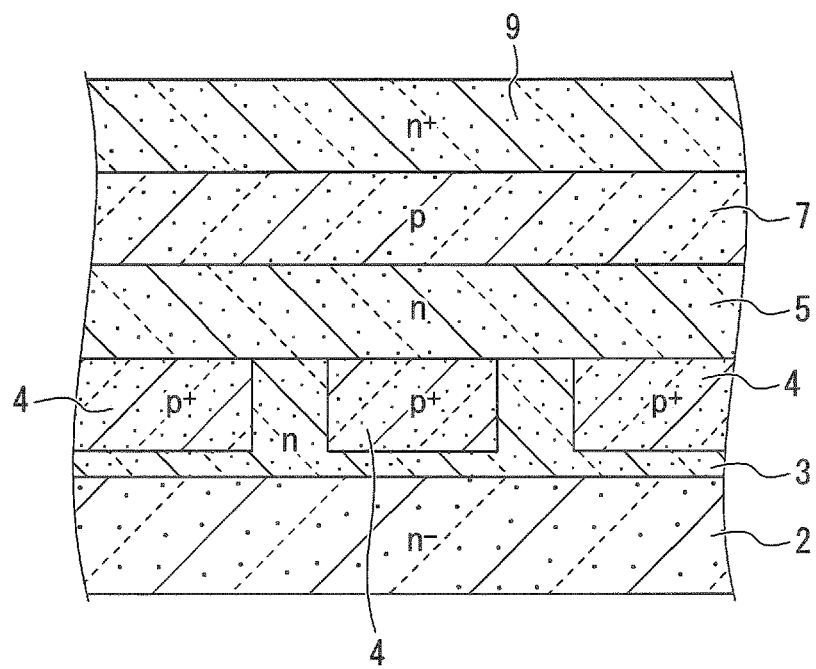
FIG. 15B is a cross-sectional view as viewed from direction A-A' in FIG. 15A.

Next, a $SiO_2$ film is laminated on the top surface of the injection control region 7, and a photoresist film further coated on the $SiO_2$ film is delineated by photolithography. Using the delineated photoresist film as a mask, the $SiO_2$ film is etched to be delineated. The photoresist film is then removed. Using the delineated $SiO_2$ film as a mask for ion implantation, n-type impurity ions such as nitrogen (N) are implanted. The mask for ion implantation is then removed, and the n-type impurity ions are activated by annealing, so as to selectively form the carrier supply region 9 of $n^+$-type in the upper portion of the injection control region 7, as illustrated in FIG. 15A and FIG. 15B.

Figure 16A:
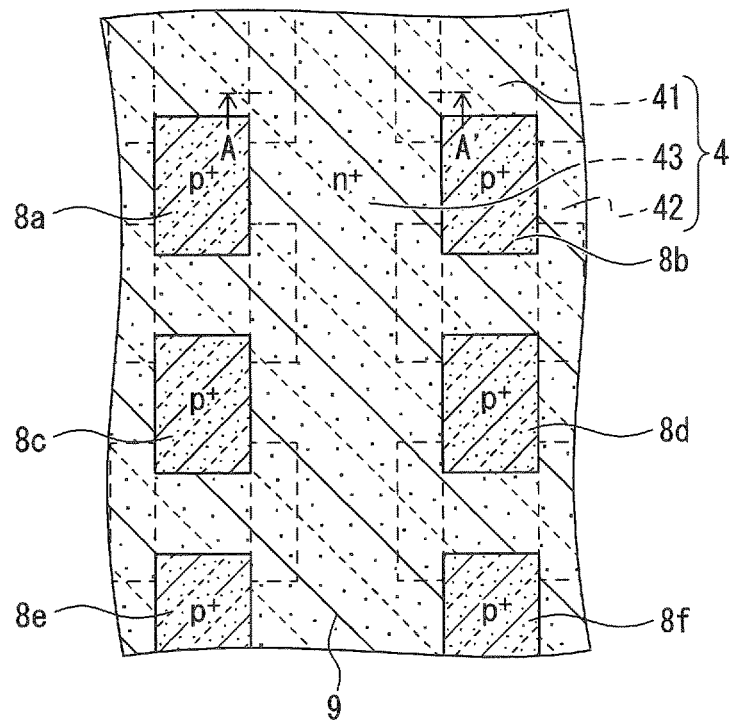
FIG. 16A is a cross-sectional view, continued from FIG. 15A and FIG. 15B, illustrating the process of manufacturing the insulated-gate semiconductor device according to the embodiment.
Figure 16B:
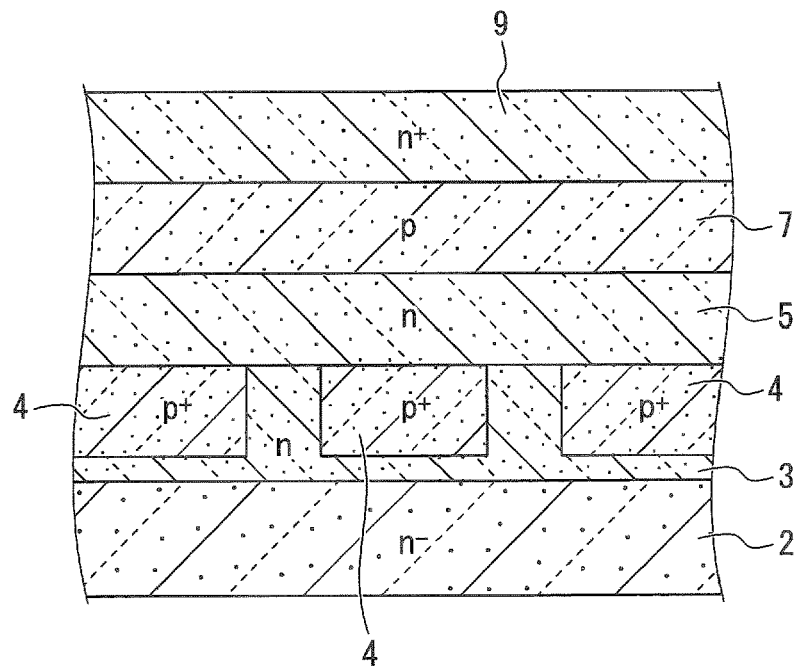
FIG. 16B is a cross-sectional view as viewed from direction A-A' in FIG. 16A.

Next, a $SiO_2$ film is laminated on the top surface of the injection control region 7, and a photoresist film further coated on the $SiO_2$ film is delineated by photolithography. Using the delineated photoresist film as a mask, the $SiO_2$ film is etched to be delineated. The photoresist film is then removed. Using the delineated $SiO_2$ film as a mask for ion implantation, p-type impurity ions such as Al are implanted. The mask for ion implantation is then removed, and the p-type impurity ions are activated by annealing, so as to selectively form the base contact regions 8a to 8f of $p^+$-type in the upper portion of the injection control region 7, as illustrated in FIG. 16A and FIG. 16B.

While the above method is illustrated with the case in which the annealing is carried out every time the ion implantation is performed to form the lower buried region 4, the upper buried regions 6a to 6f, the carrier supply region 9, and the base contact regions 8a to 8f, the annealing is not necessarily carried out every time the ion implantation is performed. For example, a single annealing step may be carried out to collectively activate the respective ion implantation regions after all ion implantation for forming the lower buried region 4, the upper buried regions 6a to 6f, the carrier supply region 9, and the base contact regions 8a to 8f is completed.

Figure 17:
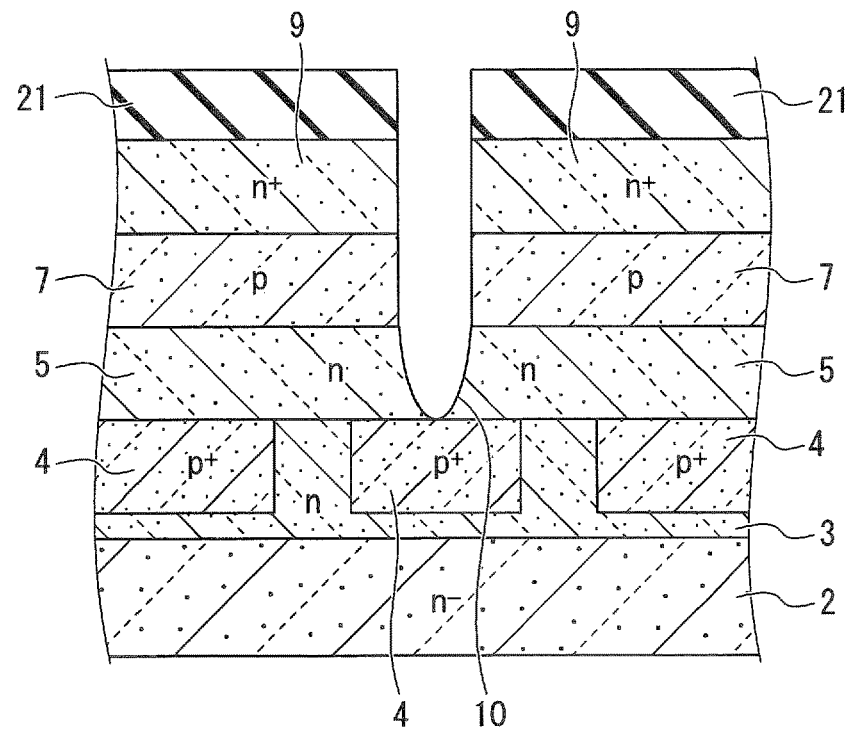
FIG. 17 is a cross-sectional view, continued from FIG. 16A and FIG. 16B, illustrating the process of manufacturing the insulated-gate semiconductor device according to the embodiment.

Next, an oxide film 21 is deposited on the top surfaces of the carrier supply region 9 and the base contact regions 8a to 8f. A photoresist film is coated on the oxide film 21, and is delineated by photolithography. Using the delineated photoresist film as a mask for etching, the oxide film 21 is delineated by dry etching such as RIE. The photoresist film is then removed. Using the oxide film 21 as a mask for etching, the trench 10 is selectively formed so as to penetrate the carrier supply region 9 and the injection control region 7 by dry etching such as RIE, as illustrated in FIG. 17. The oxide film 21 is then removed.

Figure 18:
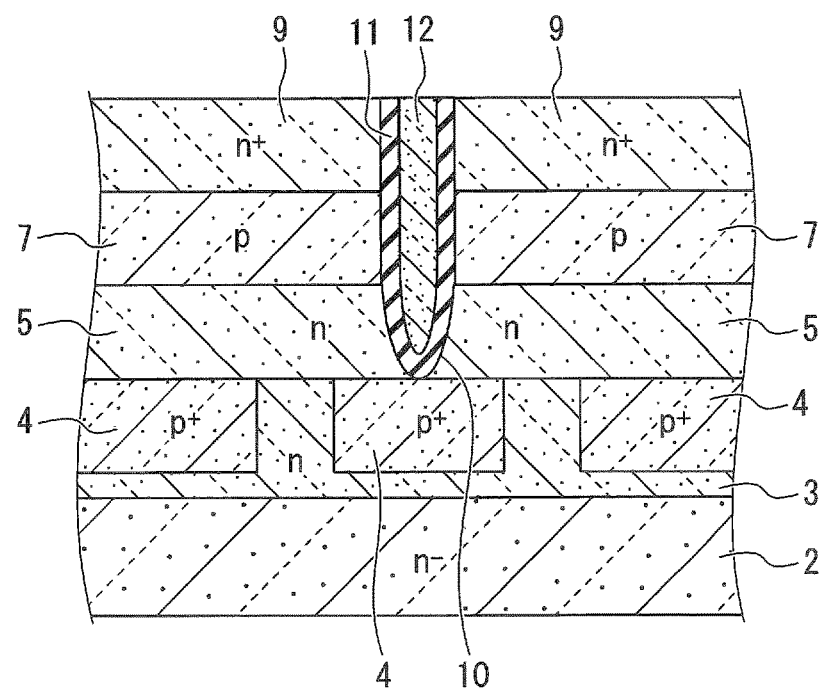
FIG. 18 is a cross-sectional view, continued from FIG. 17, illustrating the process of manufacturing the insulated-gate semiconductor device according to the embodiment.

Next, the gate insulating film 11 such as a $SiO_2$ film is laminated on the bottom and side surfaces of the trench 10, and top surfaces of the carrier supply region 9 and the base contact regions 8a to 8f of $p^+$-type by thermal oxidation or chemical vapor deposition (CVD). A polysilicon layer (doped polysilicon layer) to which p-type impurity ions such as Al are doped at a high concentration is deposited to fill the trench 10 by CVD using dopant gas. The doped polysilicon layer is partly and selectively removed by photolithography and dry etching, so as to form the pattern of the gate electrode 12 made of the doped polysilicon layer, as illustrated in FIG. 18. The insulated gate structure (11, 12) including the gate electrode 12 and the gate insulating film 11 is thus formed.

Figure 19:
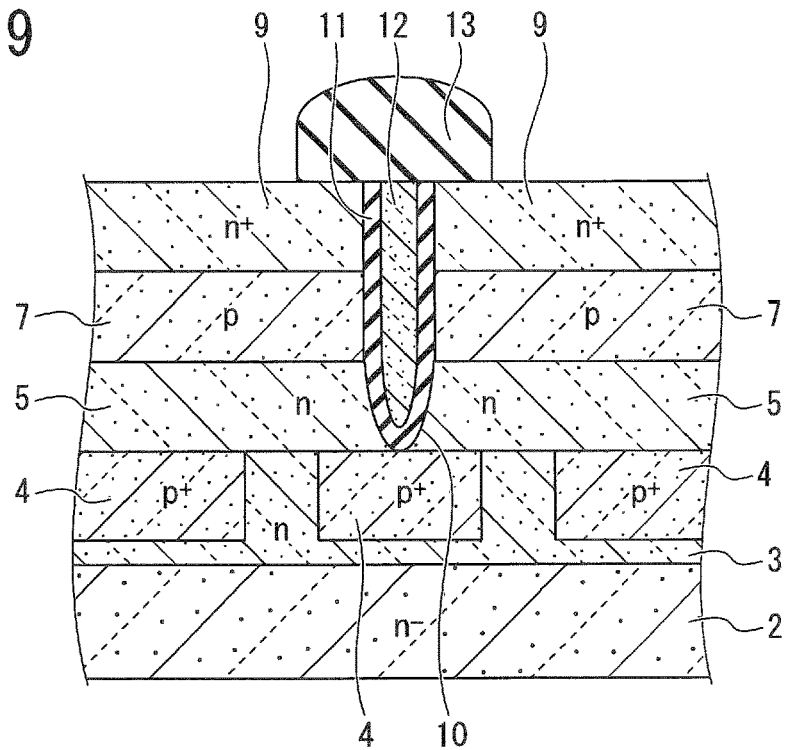
FIG. 19 is a cross-sectional view, continued from FIG. 18, illustrating the process of manufacturing the insulated-gate semiconductor device according to the embodiment.

Next, the interlayer insulating film 13 is deposited on the top surface of the insulated gate structure (11, 12) by a deposition method such as CVD. The interlayer insulating film 13 is then partly and selectively removed by photolithography and dry etching as illustrated in FIG. 19. The main electrode contact holes are thus open in the interlayer insulating film 13. Although not illustrated, the gate contact holes are also open in the interlayer insulating film 13 separately from the main electrode contact holes, so as to expose part of the gate surface electrode connected to the gat electrode 12.

Figure 20:
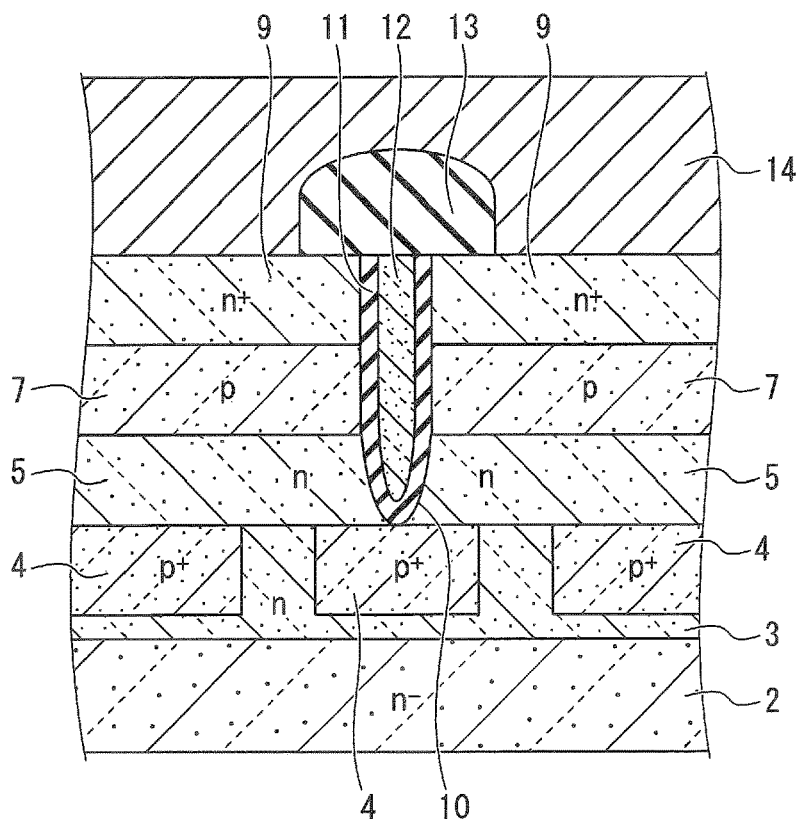
FIG. 20 is a cross-sectional view, continued from FIG. 19, illustrating the process of manufacturing the insulated-gate semiconductor device according to the embodiment.

Next, a metallic layer such as an Al film is deposited on the interlayer insulating film 13 by sputtering, for example. The metallic layer such as an Al film is delineated by photolithography and RIE, so as to form the patterns of the first main electrode 14 and the gate surface electrode (not illustrated), as illustrated in FIG. 20. The patterns of the first main electrode 14 and the gate surface electrode are separated from each other. When the source contact layer including nickel silicide (NiSix) is formed before the deposition of the metallic layer, a nickel film may be formed in the main electrode contact holes and then subjected to annealing. The unreacted nickel film is preferably removed by wet etching.

Next, the thickness of the drift layer 2 as the SiC substrate is adjusted by chemical mechanical polishing (CMP), for example. After the adjustment of the thickness, n-type impurity ions are implanted in the entire bottom surface of the drift layer 2, and the n-type impurity ions such as nitrogen (N) are activated by annealing, so as to form the carrier reception region 1. The second main electrode 15 including Au, for example, is then formed on the entire bottom surface of the carrier reception region 1 by sputtering or evaporation, as illustrated in FIG. 1 and FIG. 5. The insulated-gate semiconductor device according to the embodiment is thus completed.

The method of manufacturing the insulated-gate semiconductor device according to the embodiment can prevent variation in the device characteristics caused by the relative positional displacement between the lower buried region 4 and the upper buried region 6a to 6f around the bottom portion of the trench 10 derived from the manufacturing process.

First Modified Example

Figure 21:
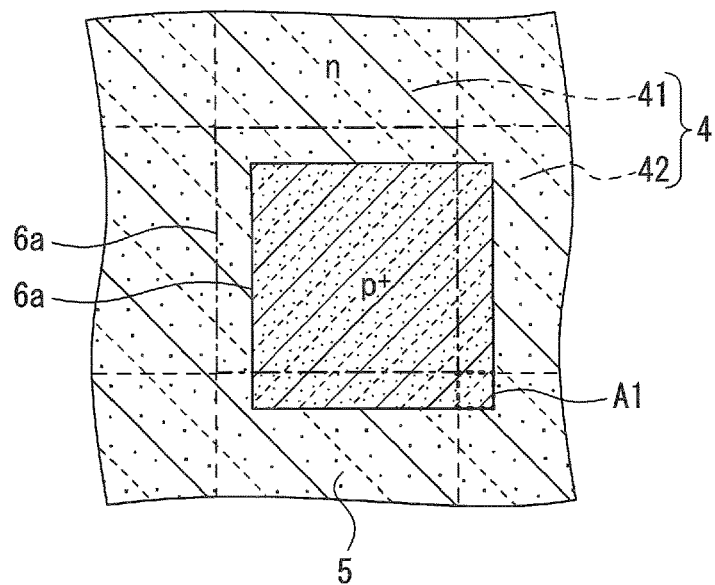
FIG. 21 is an enlarged plan view of a portion in FIG. 3.

The insulated-gate semiconductor device according to the embodiment has been illustrated with the case in which the upper buried regions 6a to 6f have a rectangular shape in a planar pattern, as illustrated in FIG. 3. FIG. 21 is a partly enlarged view of a part around the upper buried region 6a illustrated in FIG. 3. FIG. 21 indicates, by the dash-dotted line, a position of the upper buried region 6a presumed to be located without positional displacement at the intersection point of the orthogonal first stripe 41 and the lateral second stripe 42 in the lower buried region 4. As illustrated in FIG. 21, when the upper buried region 6a with the rectangular shape in the planar pattern is shifted in the orthogonal direction and the lateral direction from the orthogonal first stripe 41 and the lateral second stripe 42 in the lower buried region 4, an area Al at a corner of the upper buried region 6a protrudes from the lower buried region 4, decreasing the area of the JFET region.

Figure 22:
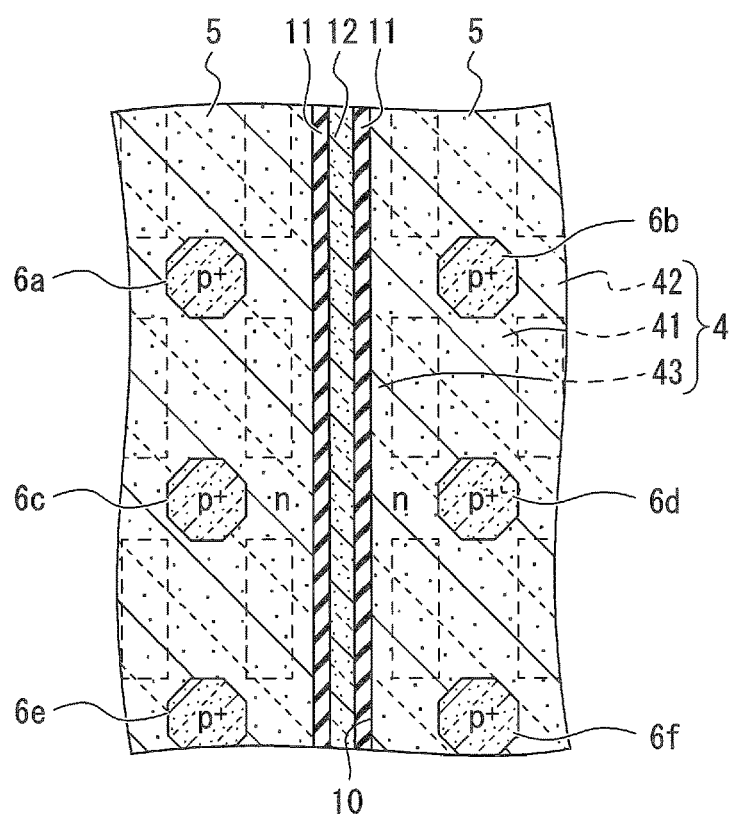
FIG. 22 is a plan view of main components illustrating an example of a semiconductor integrated circuit according to a first modified example of the embodiment.

An insulated-gate semiconductor device according to a first modified example of the embodiment differs from the insulated-gate semiconductor device according to the embodiment in that the upper buried regions 6a to 6f have an octagonal shape in a planar pattern, as illustrated in FIG. 22. The other elements in the insulated-gate semiconductor device according to the first modified example of the embodiment are the same as those in the insulated-gate semiconductor device according to the embodiment, and overlapping explanations are not repeated below.

Figure 23:
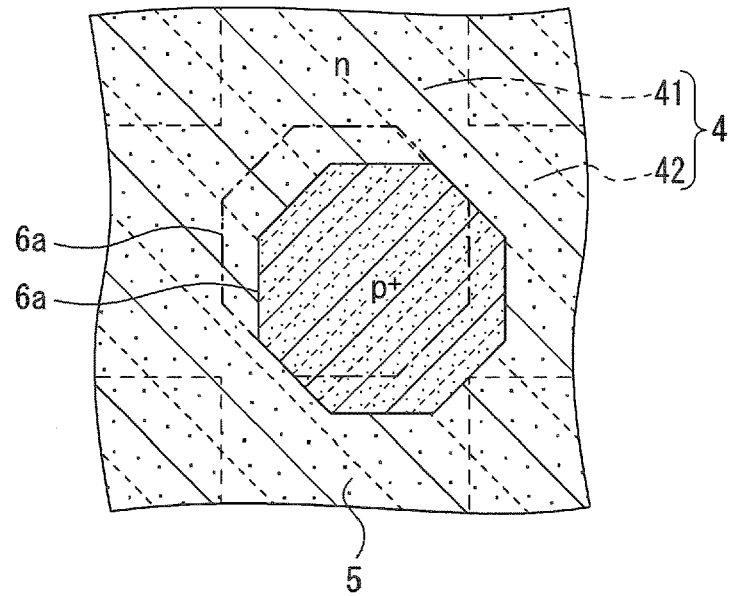
FIG. 23 is an enlarged plan view of a portion in FIG. 22.

FIG. 23 is a partly enlarged view of a part around the upper buried region 6a illustrated in FIG. 22. FIG. 23 indicates, by the dash-dotted line, a position of the upper buried region 6a presumed to be located without positional displacement at the intersection point of the orthogonal first stripe 41 and the lateral second stripe 42 in the lower buried region 4. As indicated by the solid line in FIG. 23, the upper buried region 6a, which is shifted in the orthogonal direction and the lateral direction in the planar pattern from the intersection point of the orthogonal first stripe 41 and the lateral second stripe 42 in the lower buried region 4, is still located within the lower buried region 4, so as to prevent variation in the area of the JFET region.

Figure 24:
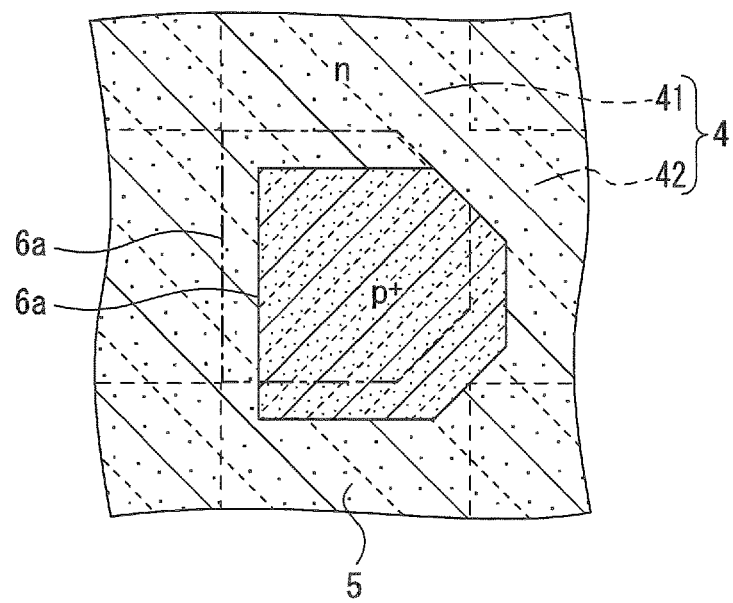
FIG. 24 is a plan view of main components illustrating another example of a semiconductor integrated circuit according to the first modified example of the embodiment.

Although not illustrated, the upper buried regions having other shapes in a planar pattern, such as a polygonal shape having six sides or greater, a circular shape, a rectangular shape in which the corners are rounded off, and a cross, in addition to the octagonal shape, can also avoid or reduce the protrusion from the lower buried region 4, so as to prevent variation in the area of the JFET region. Alternatively, the upper buried region 6a may have an asymmetric shape in the right-left direction in the planar pattern, as illustrated in FIG. 24. The upper buried region 6a may also have an asymmetric shape in the upper-lower direction in the planar pattern (not illustrated).

The insulated-gate semiconductor device according to the first modified example of the embodiment includes the upper buried regions 6a to 6f having any of a polygonal shape having six sides or greater, a circular shape, a rectangular shape in which the corners are rounded off, or a cross in a planar pattern, so as to avoid or reduce the protrusion from the lower buried region 4 if the upper buried region 6a is shifted in the orthogonal direction and the lateral direction, and prevent variation in the area of the JFET region accordingly.

Second Modified Example

The insulated-gate semiconductor device according to the embodiment has been illustrated with the case in which the upper buried regions 6a to 6f are all located at the intersection points of the orthogonal first stripes 41 and the lateral second stripes 42 in the lower buried region 4 in the planar pattern, as illustrated in FIG. 3. An insulated-gate semiconductor device according to a second modified example of the embodiment differs from the insulated-gate semiconductor device according to the embodiment in that some of the upper buried regions 6a, 6b, 6c, 6d, 6e, 6f, 6g, 6h, 6i, 6j, 6k, and 6l are also located at other positions in addition to the intersection points of the orthogonal first stripes 41 and the lateral second stripes 42 in the lower buried region 4 in the planar pattern, as illustrated in FIG. 25.

Figure 25:
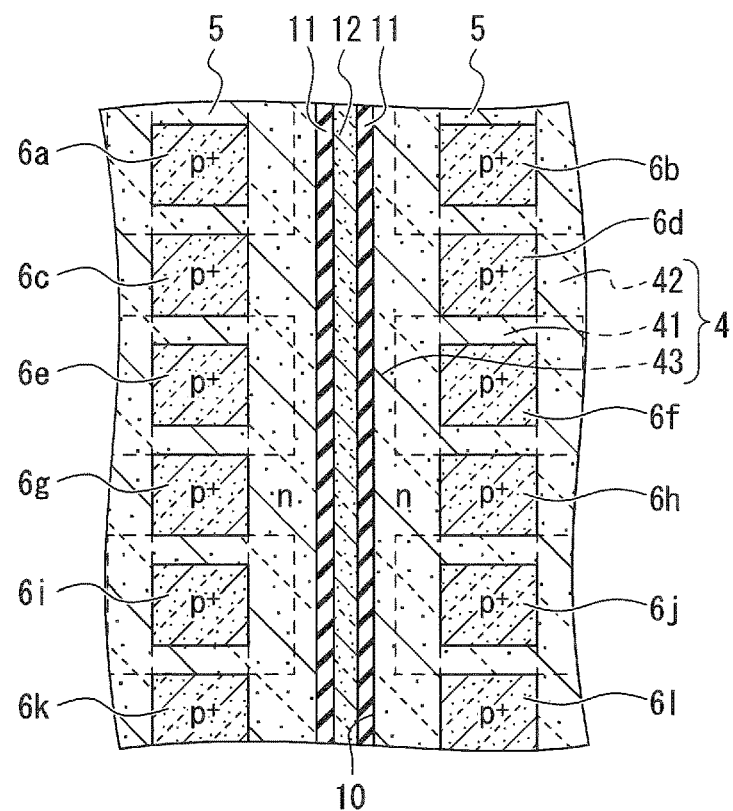
FIG. 25 is a plan view of main components illustrating an example of a semiconductor integrated circuit according to a second modified example of the embodiment.

As illustrated on the left side in FIG. 25, the upper buried regions 6c, 6g, and 6k are located at the intersection points of the orthogonal first stripe 41 and the respective lateral second stripes 42 in the lower buried region 4. The upper buried regions 6a, 6e, and 6l are located between the upper buried regions 6c, 6g, and 6k on the orthogonal first stripe 41 in the lower buried region 4. As illustrated on the right side in FIG. 25, the upper buried regions 6d, 6h, and 6l are located at the intersection points of the orthogonal first stripe 41 and the respective lateral second stripes 42 in the lower buried region 4. The upper buried regions 6b, 6f, and 6j are located between the upper buried regions 6d, 6h, and 6l on the orthogonal first stripe 41 in the lower buried region 4. The other elements in the insulated-gate semiconductor device according to the second modified example of the embodiment are the same as those in the insulated-gate semiconductor device according to the embodiment, and overlapping explanations are not repeated below.

The insulated-gate semiconductor device according to the second modified example of the embodiment, in which at least some of the upper buried regions 6a to 6l are located at the positions other than the intersection points of the orthogonal first stripes 41 and the lateral second stripes 42 in the lower buried region 4 in the planar pattern, can also minimize a decrease in the area of the JFET region if the lower buried region 4 and the upper buried regions 6a to 6l are shifted from each other, so as to prevent an increase in on-resistance, as compared with the insulated-gate semiconductor device according to the comparative example illustrated in FIG. 6. This can reduce the influence on the device characteristics derived from the positional displacement between the lower buried region 4 and the upper buried regions 6a to 6l without increasing the cell pitch.

Figure 26:
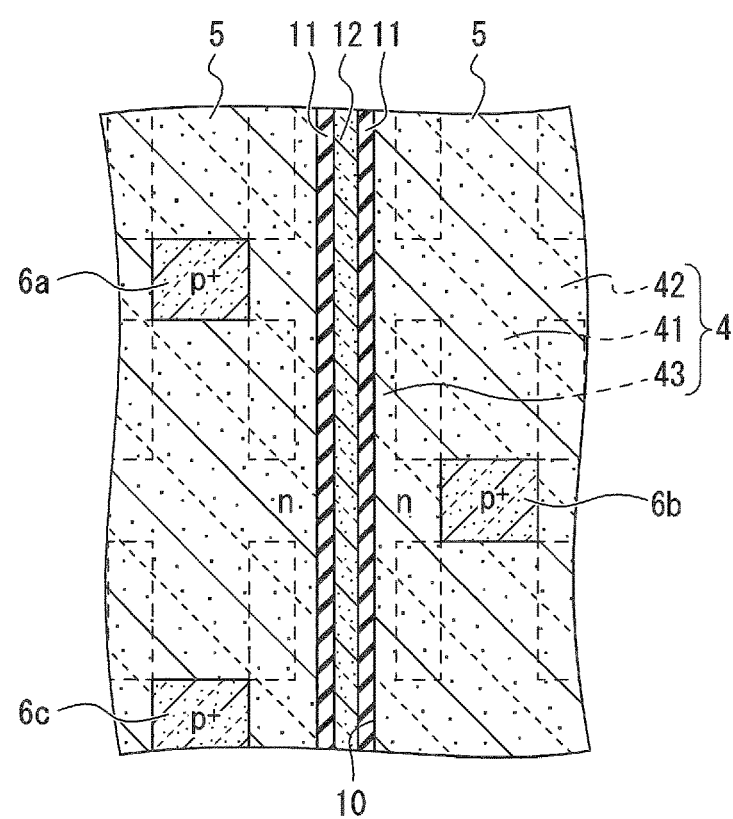
FIG. 26 is a plan view of main components illustrating another example of a semiconductor integrated circuit according to the second modified example of the embodiment.

As illustrated in FIG. 26, the upper buried regions 6a, 6b, and 6c are located at some of the intersection points of the orthogonal first stripes 41 and the lateral second stripes 42 in the lower buried region 4 in the planar pattern, and the upper buried regions are not necessarily located at all of the intersection points. The upper buried regions 6a to 6c may be arranged in the orthogonal direction asymmetrically in the right-left direction about the trench 10 in the planar pattern as illustrated in FIG. 26.

Third Modified Example

Figure 27:
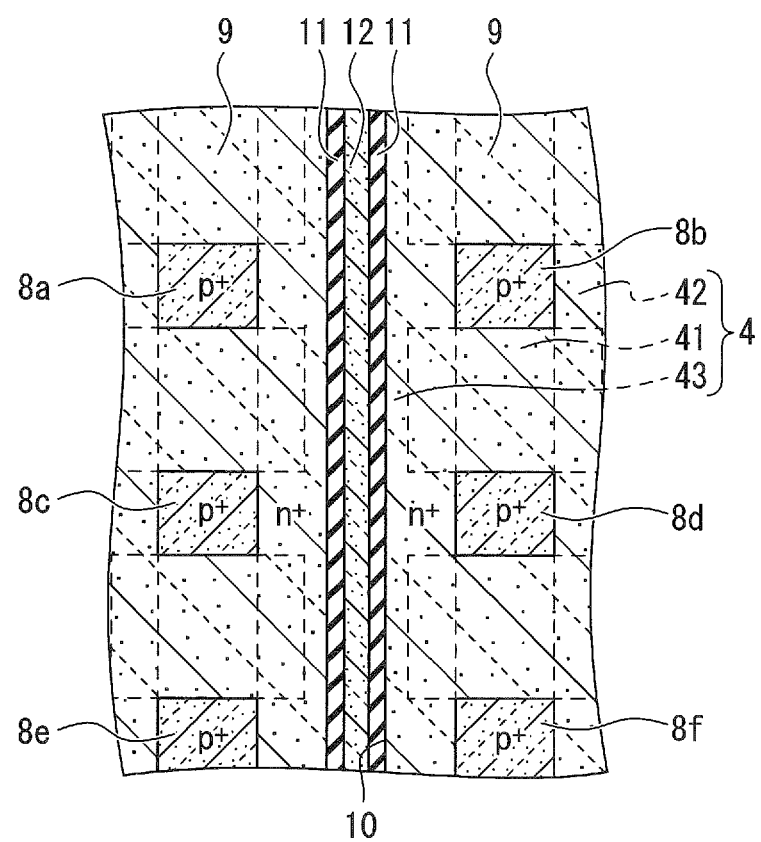
FIG. 27 is a plan view of main components illustrating an example of a semiconductor integrated circuit according to a third modified example of the embodiment.

The insulated-gate semiconductor device according to the embodiment has been illustrated with the case in which the base contact regions 8a to 8f are partly located at the respective intersection points of the orthogonal first stripes 41 and the lateral second stripes 42 in the lower buried region 4, as illustrated in FIG. 4. An insulated-gate semiconductor device according to a third modified example of the embodiment differs from the insulated-gate semiconductor device according to the embodiment in that the base contact regions 8a to 8f are entirely provided at the respective intersection points of the orthogonal first stripes 41 and the lateral second stripes 42 in the lower buried region 4, as illustrated in FIG. 27.

The base contact regions 8a to 8f are located at the positions overlapping with the upper buried regions 6a to 6f in the planar pattern. The shape and the size of the base contact regions 8a to 8f in the planar pattern may be substantially the same as those of the upper buried regions 6a to 6f. The shape of the base contact regions 8a to 8f in the planar pattern may be different from that of the upper buried regions 6a to 6f, and the size of the base contact regions 8a to 8f in the planar pattern may be different from that of the upper buried regions 6a to 6f. The base contact regions 8a to 8f may be provided at other positions on the orthogonal first stripes 41 located between the respective intersection points of the orthogonal first stripes 41 and the lateral second stripes 42 in the lower buried region 4. The other elements in the insulated-gate semiconductor device according to the third modified example of the embodiment are the same as those in the insulated-gate semiconductor device according to the embodiment, and overlapping explanations are not repeated below.

The insulated-gate semiconductor device according to the third modified example of the embodiment enables the adjustment of the voltage Vf in the forward direction in the built-in diode such that the position, shape, and size of the base contact regions 8a to 8f in the planar pattern relative to the upper buried regions 6a to 6f are regulated. For example, the positions of the base contact regions 8a to 8f in the planar pattern are set to overlap with the positions of the upper buried regions 6a to 6f, so as to decrease the voltage Vf in the forward direction in the built-in diode.

Other Embodiments

As described above, the invention has been described according to the embodiments, but it should not be understood that the description and drawings implementing a portion of this disclosure limit the invention. Various alternative embodiments of the present invention, examples, and operational techniques will be apparent to those skilled in the art from this disclosure.

The embodiment has been illustrated with the MISFET having the insulated gate structure (11, 12) in the trench 10. The embodiment is not limited to this case, and may be applied to insulated-gate semiconductor devices having various types pf insulated gate structures such as an IGBT having an insulated gate structure in a trench. A trench gate IGBT to which the embodiment is presumed to be applied may have a structure in which the carrier supply region 9 of $n^+$-type in the MISFET illustrated in FIG. 1 is used as an emitter region, and a collector region of pt-type is provided as a carrier reception region on the bottom surface of the drift layer 2.

The embodiment has been illustrated with the case in which the trench 10 has a stripe-like shape in a planar pattern, but is not limited to this case. For example, the trench may have a rectangular shape or a polygonal shape such as a hexagon in a planar pattern.

The insulated-gate semiconductor device according to the embodiment has been illustrated with the case of being made of SiC. The embodiment can also be applied to an insulated-gate semiconductor device made of a semiconductor (wide-bandgap semiconductor) material having a wider band gap than Si, such as gallium nitride (GaN), diamond, or aluminum nitride (AlN) having a smaller diffusion coefficient than Si.

What is claimed is:

1. An insulated-gate semiconductor device comprising:
   a carrier transport layer of a first conductivity-type made of a semiconductor material having a wider band gap than silicon;
   a lower buried region of a second conductivity-type selectively buried in an upper portion of the carrier transport layer;
   a plurality of upper buried regions of the second conductivity-type dispersedly deposited on the lower buried region and buried in the upper portion of the carrier transport layer;
   an injection control region of the second conductivity-type deposited on the carrier transport layer and the upper buried regions; and
   an insulated gate structure using a trench penetrating the injection control region toward a top surface of the lower buried region so as to control a surface potential of the injection control region adjacent to a side wall of the trench,
   wherein the trench has a stripe-like shape in a planar pattern,
   the lower buried region includes a first stripe provided separately from the trench in the planar pattern and is elongated in a first direction, and
   the respective upper buried regions are provided at intervals on the first stripe so as to be spaced apart from one another in the first direction.

2. The insulated-gate semiconductor device of claim 1, wherein the carrier transport layer includes:
   a drift layer of the first conductivity-type in which majority carriers as a main current drift by a drift electric field; and
   a carrier diffusion region of the first conductivity-type deposited on the drift layer and allowing the majority carriers injected from the injection control region to be diffused and transferred.

3. The insulated-gate semiconductor device of claim 2, wherein the carrier diffusion region includes:
   a lower current spreading layer of the first conductivity-type deposited on the drift layer and having a higher impurity concentration than the drift layer; and
   an upper current spreading layer of the first conductivity-type selectively deposited on the lower current spreading layer and the lower buried region.

4. The insulated-gate semiconductor device of claim 2, further comprising a carrier supply region of the first conductivity-type having a higher impurity concentration than the carrier diffusion region and selectively deposited on the injection control region to supply the majority carriers to the injection control region, wherein the trench penetrates the carrier supply region and the injection control region toward the top surface of the lower buried region.

5. The insulated-gate semiconductor device of claim 1, wherein the lower buried region further includes:
a third stripe provided under the trench; and
a second stripe connecting the first stripe and the third stripe.

6. The insulated-gate semiconductor device of claim 5, wherein the first, second, and third stripes included in the lower buried region implement a matrix form in the planar pattern.

7. The insulated-gate semiconductor device of claim 5, wherein a bottom of the trench is in contact with the third stripe or is close to the third stripe via the carrier transport layer by an order of a Debye length.

8. The insulated-gate semiconductor device of claim 5, wherein at least part of the plurality of upper buried regions is located at an intersection point of the first stripe and the second stripe in the planar pattern.

9. The insulated-gate semiconductor device of claim 5, wherein at least part of the plurality of upper buried regions is located at a position on the first stripe different from an intersection point of the first stripe and the second stripe in the planar pattern.

10. The insulated-gate semiconductor device of claim 1, wherein the respective upper buried regions have any of a polygonal shape having six sides or greater, a circular shape, or a rectangular shape in which corners are rounded off in the planar pattern.

11. The insulated-gate semiconductor device of claim 1, further comprising a base contact region of the second conductivity-type selectively deposited on the injection control region,
wherein the base contact region overlaps with the upper buried regions in the planar pattern.

12. The insulated-gate semiconductor device of claim 1, wherein the semiconductor material is silicon carbide.

13. The insulated-gate semiconductor device of claim 1, further comprising a plurality of base contact regions of the second conductivity-type selectively deposited at intervals on the injection control region so as to be spaced apart from one another in the first direction.

14. The insulated-gate semiconductor device of claim 1, wherein the lower buried region further includes:
a second stripe having a stripe-like shape in a planar pattern and elongated in a second direction perpendicular to the first direction,
wherein
each upper buried region has a width in the first direction which corresponds to a width of the second stripe in the first direction, and
each upper buried region has a width in the second direction which corresponds to a width of the first stripe in the second direction.

15. The insulated-gate semiconductor device of claim 1, wherein the trench is elongated in the first direction.

* * * * *